(12) United States Patent
Daniel et al.

(10) Patent No.: US 8,313,332 B2
(45) Date of Patent: Nov. 20, 2012

(54) OBLIQUE PARTS OR SURFACES

(75) Inventors: Jurgen Daniel, Mountain View, CA (US); David K. Fork, Los Altos, CA (US); Armin R. Völkel, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/704,604

(22) Filed: Feb. 12, 2010

(65) Prior Publication Data

US 2010/0144216 A1 Jun. 10, 2010

Related U.S. Application Data

(62) Division of application No. 10/974,933, filed on Oct. 27, 2004, now Pat. No. 7,771,803.

(51) Int. Cl.
*B81B 3/00* (2006.01)
*B81C 1/00* (2006.01)
*G01R 1/067* (2006.01)

(52) U.S. Cl. ............................ 439/66; 29/874; 439/81

(58) Field of Classification Search ............ 324/755.01; 439/82, 884, 81; 29/874
See application file for complete search history.

(56) References Cited

U.S. PATENT DOCUMENTS

| | | | |
|---|---|---|---|
| 4,950,173 A * | 8/1990 | Minemura et al. ............. | 439/82 |
| 5,513,430 A * | 5/1996 | Yanof et al. .................... | 29/846 |
| 5,613,861 A | 3/1997 | Smith et al. | |
| 5,771,902 A * | 6/1998 | Lee et al. ...................... | 128/897 |
| 6,184,053 B1 | 2/2001 | Eldridge et al. | |
| 6,299,462 B1 | 10/2001 | Biegelsen | |
| 6,300,665 B1 | 10/2001 | Peeters et al. | |
| 6,334,856 B1 | 1/2002 | Allen et al. | |
| 6,452,406 B1 * | 9/2002 | Beaman et al. ......... | 324/755.01 |
| 6,458,231 B1 | 10/2002 | Wapner et al. | |
| 6,525,806 B1 * | 2/2003 | Smith ............................ | 355/71 |
| 6,528,350 B2 | 3/2003 | Fork | |
| 6,616,966 B2 | 9/2003 | Mathieu et al. | |
| 6,632,373 B1 | 10/2003 | Rosa et al. | |
| 6,632,374 B1 | 10/2003 | Rosa et al. | |
| 6,646,533 B2 | 11/2003 | Biegelson et al. | |
| 6,713,374 B2 | 3/2004 | Eldridge et al. | |
| 6,727,580 B1 | 4/2004 | Eldridge et al. | |
| 6,734,425 B2 | 5/2004 | Hantschel et al. | |
| 6,923,054 B2 * | 8/2005 | Liu et al. .................... | 73/204.27 |
| 7,118,389 B2 | 10/2006 | Fork et al. | |
| 7,288,327 B2 | 10/2007 | Daniel et al. | |
| 7,435,108 B1 | 10/2008 | Eldridge et al. | |

(Continued)

OTHER PUBLICATIONS

Madou, M., Fundamentals of Microfabrication, Boca Raton, CRC Press, 1997, pp. 275, 291-323.

(Continued)

*Primary Examiner* — Livius R Cazan
(74) *Attorney, Agent, or Firm* — Hollingsworth Davis, LLC

(57) ABSTRACT

Various structures, such as microstructures and wall-like structures, can include parts or surfaces that are oblique. In some implementations, a cantilevered element includes a spring-like portion with a uniformly oblique surface or with another artifact of an oblique radiation technique. In some implementations, when a deflecting force is applied, a spring-like portion can provide deflection and spring force within required ranges. Various oblique radiation techniques can be used, such as radiation of a layer through a prism, and structures having spring-like portions with oblique radiation artifacts can be used in various applications, such as with downward or upward deflecting forces.

17 Claims, 19 Drawing Sheets

U.S. PATENT DOCUMENTS

| | | |
|---|---|---|
| 7,517,043 B2 | 4/2009 | Fitch et al. |
| 2003/0199179 A1 | 10/2003 | Dozier, II et al. |
| 2004/0068023 A1 | 4/2004 | Leatherdale et al. |
| 2006/0070226 A1 | 4/2006 | Daniel et al. |
| 2006/0087064 A1 | 4/2006 | Daniel et al. |
| 2006/0116010 A1 | 6/2006 | Fork et al. |
| 2006/0130319 A1 | 6/2006 | DiStefano |
| 2006/0132531 A1 | 6/2006 | Fitch et al. |

OTHER PUBLICATIONS

Andricacos, P.C. and Robertson, N., "Future directions in electroplated materials for thin film recording heads," IBM Journal of Research and Development, vol. 42, No. 5, 1998, pp. 671-680.

Bostock, R.M., Collier, J.D., Jansen, R-J.E., Jones, R., Moore, D.F., Townsend, J.E., "Silicon nitride microclips for the kinematic location of optic fibres in silicon V-shaped grooves," J. Micromech. Microeng., vol. 8, 1998, pp. 343-360.

Michel, F. and Ehrfeld, W., "Microfabrication Technologies for High Performance Microactuators," in Bushan, B., Ed., Tribology Issues and Opportunities in MEMS, Kluwer Academic Publishers, Dordrecht, NL, 1998, pp. 53-84 (missing pp. 72-73).

Suh, J.W., Darling, R.B., Bohringer, K.-F., Donald, B.R., Baltes, H., and Kovacs, G.T.A., "CMOS Integrated Ciliary Actuator Array as a General-Purpose Micromanipulation Tool for Small Objects," J. of Microelectromechanical Systems, vol. 8, No. 4, Dec. 1999, pp. 483-496.

"Corning Polymer GRIPPER," WDM Solutions, Aug. 2002, p. 12.

Joung, Y.-H. and Allen, M.G., "Micromachined Flexible Interconnect for Wafer Level Packaging," Proceedings of 2001 ASME: International Mechanical Engineering Congress and Exposition, Nov. 11-16, 2001, New York, New York, pp. 1-5.

Mariner, B., "A Revolution in Test—The Death of Packaging," Semiconductor Fabtech, 10th Ed., pp. 317-319, printed from www.semiconductorfabtech.com/journals/edition.10/download/ft10-8_03.pdf, last modified May 22, 2002.

"Corning Polymer Gripper," PI105, Corning Incorporated, Sep. 2002, pp. 1-2.

Han, M.H., Lee, W.S., Lee, S.-K., and Lee, S.S., "Fabrication of 3D Microstructures with Single uv Lithography Step," J. of Semiconductor Technology and Science, vol. 2, No. 4, Dec. 2002, pp. 268-271.

Bakir, M.S., Reed, H.A., Mule, A.V., Jayachandran, J.P., Kohl, P.A., Martin, K.P., Gaylord, T.K., and Meindl, J.D., "Chip-to-Module Interconnections Using 'Sea of Leads' Technology," MRS Bulletin, Jan. 2003, pp. 61-67.

Moore, D.F. and Syms, R.R.A., "Silicon technology for optical MEMS," Europhysics News, vol. 34, No. 1, 2003, printed on pp. 1-11.

Bakir, M.S., Reed, H.A., Thacker, H.D., Patel, C.S., Kohl, P.A., Martin, K.P., and Meindl, J.D., "Sea of Leads (SoL) Ultrahigh Density Wafer-Level Chip Input/Output Interconnections for Gigascale Integration (GSI)," IEEE Transactions on Electron Devices, vol. 50, No. 10, Oct. 2003, pp. 2039-2048.

Keezer, D.C., Patel, C.S., Bakir, M.S., Zhou, Q., and Meindl, J.D., "Electrical Test Strategies for a Wafer-Level Packaging Technology," IEEE Transactions on Electronics Packaging Manufacturing, vol. 26, No. 4, Oct. 2003, pp. 267-272.

Baselt, D., "Atomic force microscopy—Measuring intermolecular interaction forces," http://stm2.nrl.navy.mil/how-afm/how-afm.html, printed on Jun. 2, 2004, pp. 1-11.

Riley, G., "Stud Bumping 300 mm Wafers," http://www.flipchips.com/update14.html, printed on Jun. 24, 2004, pp. 1-2.

Yu, H., Gruntzig, A., Zhao, Y., Sharon, A., Li, B., and Zhang, X., "Direct Writing of 3D Microstructures Using a Scanning Laser System," Mat. Res. Soc. Symp. Proc. vol. 782, 2004, pp. A11.5.1 to A11.5.6.

Hedler, H., "ELASTec : A Wafer Level Package for Memory Products," Infineon Technologies, Special Promotional Supplement to Semiconductor International, pp. 15-17.

Hung, K.-Y., Hu, H.-T., Tseng, F.-G., "Application of 3D glycerol-compensated inclined-exposure technology to an intgrated optical pick-up head," J. Micromech. Microeng., vol. 14, 2004, pp. 975-983.

Office communication in U.S. Appl. No. 10/974,933, mailed Jan. 27, 2009, 16 pages.

Amendment in U.S. Appl. No. 10/974,933, submitted Apr. 24, 2009, 26 pages.

Office communication in U.S. Appl. No. 10/974,933, mailed Sep. 3, 2009, 6 pages.

Amendment After Final Rejection in U.S. Appl. No. 10/974,933, submitted Sep. 25, 2009, 27 pages.

Office communication in U.S. Appl. No. 10/974,933, mailed Oct. 22, 2009, 4 pages.

Amendment with Request for Continued Examination in U.S. Appl. No. 10/974,933, submitted Nov. 12, 2009, 29 pages.

Notice of Allowance and Fee(s) Due in U.S. Appl. No. 10/974,933, mailed Jan. 13, 2010, 14 pages.

* cited by examiner

FIG. 35
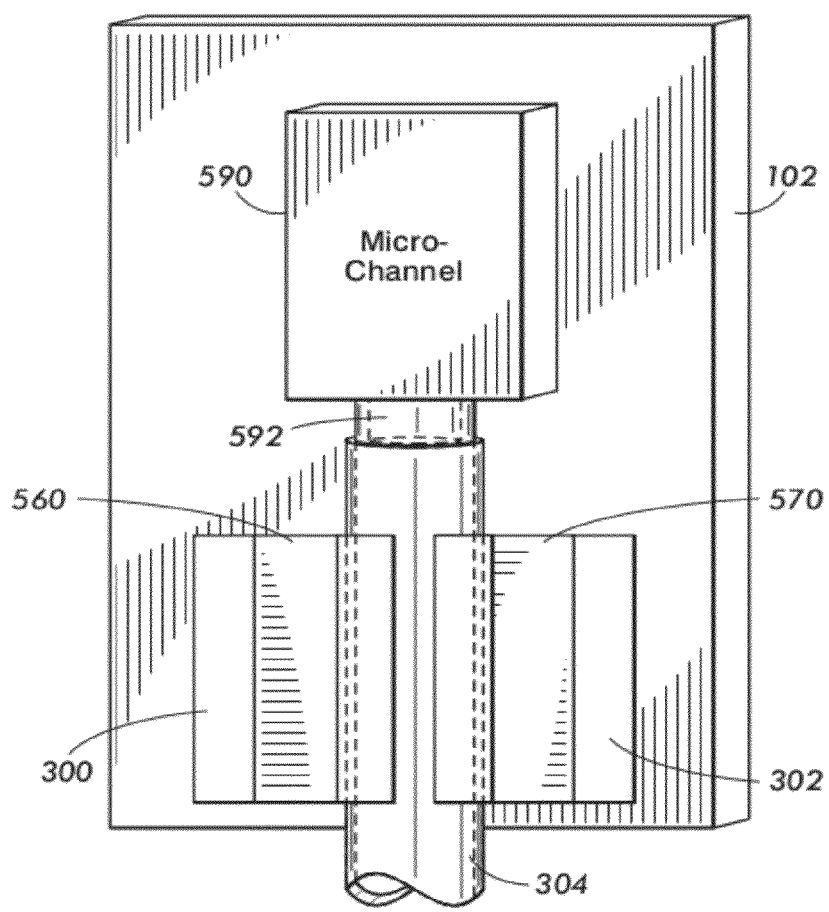
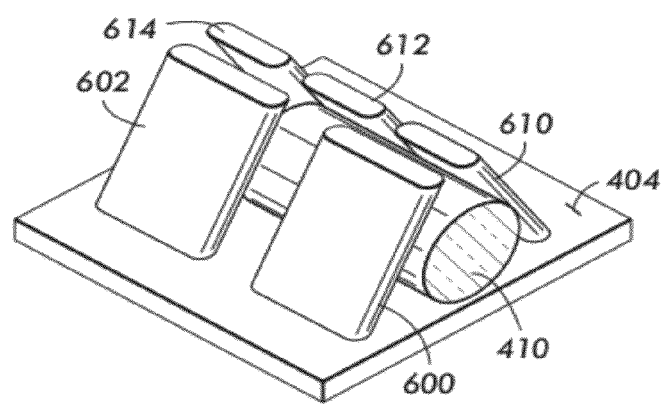
FIG. 36

OBLIQUE PARTS OR SURFACES

CROSS-REFERENCE TO RELATED APPLICATIONS

This application is a divisional of U.S. application Ser. No. 10/974,933, filed Oct. 27, 2004, now U.S. Pat. No. 7,771,803, the entire contents of which is incorporated herein by reference.

BACKGROUND OF THE INVENTION

The present invention relates generally to techniques in which structures have oblique parts or surfaces. For example, microstructures or walls may have parts that extend obliquely relative to a substrate's surface.

Various techniques have been developed for producing structures with one or more dimensions smaller than 1 mm. In particular, some techniques for producing such structures are referred to as "microfabrication." Examples of microfabrication include various techniques for depositing materials such as sputter deposition, evaporation techniques, plating techniques, spin coating, and other such techniques; techniques for patterning materials, such as photolithography; techniques for polishing, planarizing, or otherwise modifying exposed surfaces of materials; and so forth.

Various types of structures with oblique parts have been proposed. For example, bent metal parts with oblique angles have been used in connectors and for other purposes in electronic assemblies, sometimes being bonded to a printed circuit board or other substrate or structure, such as by soldering or gluing.

Also, spring contacts and other microfabricated structures have been proposed in which parts extend obliquely from a surface. U.S. Pat. Nos. 6,184,053 and 6,727,580, for example, describe spring contact elements, each with a base end, a contact end, and a central body portion. The contact end is offset horizontally and vertically from the base end. The elements are fabricated by depositing at least one layer of metallic material into openings defined in masking layers deposited on a surface of a substrate. Other techniques for spring contacts and similar structures are described in U.S. Pat. Nos. 5,613,861; 6,528,350; and 6,616,966 and U.S. Patent Application Pub. No. 2003/0199179-A1.

Previous techniques are limited, however, in their ability to produce a wide variety of structures such as cantilevers or walls with oblique parts or surfaces. It would therefore be advantageous to have additional techniques for structures with oblique parts or surfaces.

SUMMARY OF THE INVENTION

The invention provides various exemplary embodiments of methods, apparatus, and structures. In general, each embodiment involves a portion, section, or other part or a surface that can be characterized as oblique.

These and other features and advantages of exemplary embodiments of the invention are described below with reference to the accompanying drawings, in which like reference numerals refer to components that are alike or similar in structure or function.

BRIEF DESCRIPTION OF THE DRAWINGS

FIG. 35 is a schematic top view of apparatus including structures as in FIG. 32 holding a capillary tube connected to a microchannel.

FIG. 36 is a perspective view of an apparatus in which oblique cylinder-like structures hold an object.

DETAILED DESCRIPTION

Figure 1:
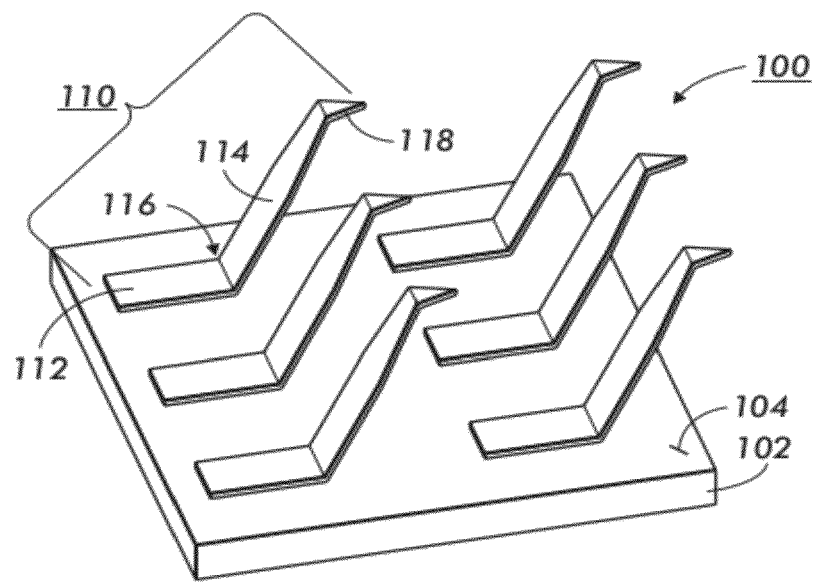
FIG. 1 is a perspective view of an array of microstructures with spring cantilevers that include oblique parts.

In the following detailed description, numeric ranges are provided for various aspects of the embodiments described. These recited ranges are to be treated as examples only, and are not intended to limit the scope of the claims. In addition, a number of materials are identified as suitable for various facets of the embodiments. These recited materials are to be treated as exemplary, and are not intended to limit the scope of the claims.

In general, the structures, elements, and components described herein are supported on a "support structure" or "support surface", which terms are used herein to mean a structure or a structure's surface that can support other structures; more specifically, a support structure could be a "substrate", used herein to mean a support structure on a surface of which other structures can be formed or attached by microfabrication or similar processes.

The surface of a substrate or other support surface is treated herein as providing a directional orientation as follows: A direction away from the surface is "up" or "over", while a direction toward the surface is "down" or "under". The terms "upper" and "top" are typically applied to structures, components, or surfaces disposed away from the surface, while "lower" or "underlying" are applied to structures, components, or surfaces disposed toward the surface. In general, it should be understood that the above directional orientation is arbitrary and only for ease of description, and that a support structure or substrate may have any appropriate orientation.

In addition, the term "oblique" is used herein to characterize an orientation that is neither parallel nor perpendicular to a reference plane, typically a support surface. If a support surface is not planar, "obliqueness" is determined relative to an intersection region in which a part or surface having a given orientation meets the support surface or would, if extended along the given orientation toward the support surface, meet the support surface. For example, if the intersection region is approximately planar, obliqueness can be determined relative to a tangent or normal to the intersection region.

A component or element "extends obliquely" relative to a surface when the component or element extends in one or more directions that are neither parallel nor perpendicular to the surface or to the intersection region of the component or element with the surface. A part of a structure, a component, or an element that extends obliquely may be referred to herein as an "oblique part".

In some implementations, an oblique part may "extend obliquely away", meaning that it extends in a direction that is neither parallel nor perpendicular to a support surface or in a range of directions that does not include parallel or perpendicular to the support surface. Similarly, an oblique part may "extend obliquely along a length" from a part supported on a surface to a free part or end, meaning that it extends along a length from the part supported on the surface to the free part or end and at no intermediate point along the length is its direction parallel or perpendicular to the surface.

A structure or component is "directly on" a surface when it is both over and in contact with the surface. A structure is "fabricated on" a surface when the structure was produced on or over the surface by microfabrication or similar processes.

A structure or component is "attached" to another when the two have surfaces that contact each other and the contacting surfaces are held together by more than mere mechanical contact, such as by an adhesive, a thermal bond, or a fastener, for example.

A process that produces a layer or other accumulation of material over or directly on a substrate's surface can be said to "deposit" the material, in contrast to processes that attach a part such as by forming a wire bond. A structure or component over which material is deposited and that has a shape that is followed by the deposited material is sometimes referred to herein as a "mold".

Some exemplary embodiments of the invention are "microstructures", a term used herein to mean a structure with a maximum dimension less than 10 mm and with at least one outside dimension less than 1.0 mm. For example, a relatively large microstructure could be 5.0 mm high and 0.5 mm wide. In general, no minimum dimension is specified for microstructures, but specific materials, functional characteristics, or other constraints may require that a microstructure have at least some appropriate minimum dimension.

FIG. 1 shows array 100 of microstructures on substrate 102. Array 100 illustratively includes six substantially identical microstructures all supported on surface 104 of substrate 102. Each of the microstructures is an example of a "cantilevered element", which is used herein to mean an element that is supported only on one part, that extends from the supported part to a free part, and that has at least one outer dimension substantially orthogonal to but smaller than the element's length from the supported part to the free part. For example, the substantially orthogonal, smaller dimension of a tubular cantilevered element could be its diameter; if a cantilevered element is a wall, its thickness, and possibly also its width, could be substantially orthogonal and smaller than its length. In FIG. 1, each microstructure has both a thickness and a width that are less than the length from where it is supported on surface 104 to its free part. The ratio of length to thickness is illustratively greater than 20, and the ratio of length to width is illustratively about 4, but these are merely exemplary, and various other ratios could be successfully implemented.

Representative microstructure 110 includes three parts, each of which is substantially planar. As used herein, a surface is "substantially planar" if it lies entirely or almost entirely in a plane. Similarly, a part or portion of a structure is "substantially planar" if it has two substantially planar surfaces that are substantially parallel and are separated by a distance or "thickness" that is significantly smaller than other dimensions of the part or portion. For example, part of a microstructure would be substantially planar if its thickness were approximately 10% or less of its largest dimension. A part of a larger cantilevered element fabricated on a substrate, such as a wall, would be substantially planar if its thickness were approximately 10% or less of its length from its base to its free part.

First part 112 is supported on surface 104, providing an example of a base of a cantilevered element. The term "base" is typically used herein to mean the part on which a cantilevered element is supported, and the base is typically directly on or over a support surface, as in FIG. 1.

Second part 114 connects or joins to first part 112 at joint 116. Third part 118 is connected or joined to second part 114 at the end opposite first part 112. In array 100, third part 118 provides an example of a free part of a cantilevered element, but a free part could merely be an end of an obliquely extending part or could have any other appropriate structure or shape, some examples of which are described below. Third part 118 is substantially parallel to surface 104 when microstructure 110 is unstressed, and therefore does not extend obliquely relative to surface 104.

As shown, second part 114 extends obliquely away from surface 104. More particularly, second part 114 extends obliquely in relation to surface 104 and in relation to a central plane of first part 112, which is substantially parallel to surface 104 and therefore perpendicular to the normal to surface 104.

Second part 114 and most other oblique parts, components, and other elements described below have both an "upper surface," meaning an upward-facing portion of surface, and also a "lower surface," meaning a downward-facing portion of surface. In general, an oblique element's upper and a lower surface, rather than being planar as in FIG. 1, could instead be curved (as with a cylinder, for example) or polygonal (as with a hexagon, for example). In addition, an oblique element could have surfaces facing laterally rather than upward or downward, i.e. side surfaces perpendicular to the support surface. It is also within the scope of the invention to provide an oblique element with either an upper surface and an opposite surface that is perpendicular to the substrate rather than facing downward or with a lower surface and an opposite surface that is perpendicular to the surface rather than facing upward.

A specific feature of second part 114 is its substantially planar lower surface, described in greater detail below, also extending obliquely away from surface 104. As used herein, a substantially planar surface or part of a surface is "oblique" in relation to a support surface if the substantially planar surface or part extends in a direction that is neither parallel nor perpendicular to the support surface.

An oblique substantially planar surface is one example of "uniformly oblique" surfaces. As used herein, a surface or part of surface is "uniformly oblique" if the tangents at all points of the surface or part of surface that provide the shortest distances to any relevant reference plane all extend in approximately the same oblique direction, subject to process limitations as described below. In addition to oblique substantially planar surfaces, various other surfaces or parts of surfaces would be uniformly oblique, including upper and lower surfaces of oblique walls of various curved or irregular shapes.

The presence of a uniformly oblique surface is a significant artifact of certain advantageous techniques for fabricating structures on surfaces, referred to herein as "oblique radiation techniques" because they are characterized by application of oblique radiation to a layer of material. If the material is photoresist, oblique radiation at appropriate wavelengths exposes it, allowing removal either of unexposed or exposed regions if the photoresist is negative or positive, respectively. For a wider range of materials, oblique laser radiation can be used to perform ablation, removing material in the laser radiation's path. Oblique radiation techniques generally depend on the depth of the layer to which oblique radiation is applied; for example, because photoresist and other polymers act to block light by absorption, the depth of effective photo-exposure is limited, such as to 2-3 mm or less for SU-8 layers.

A cantilevered element could be produced in various ways using oblique radiation techniques, some of which are described below. For example, a polymer cantilevered element could be produced by exposing and developing a negative photoresist such as SU-8 or by performing laser ablation on a layer of polymer material. A polymer plating mold or insert mold could be produced by either of those techniques, and could then be used to produce a cantilevered element by a plating or embossing operation, respectively.

When produced in any of these ways, a resulting cantilevered element will typically have at least one "oblique radiation artifact", meaning an artifact of the oblique radiation process used to produce it. For example, when a cantilevered element is produced through a process that includes oblique radiation techniques, it may have a section with a uniformly oblique surface, and the section may extend along most of the length from the cantilevered element's base to its free end. Similarly, oblique radiation techniques can produce a polymer plating mold with a uniformly oblique upper surface, in which case a cantilevered element plated on the mold usually has a uniformly oblique lower surface along most of its length. Also, oblique radiation techniques can produce an insert mold with uniformly oblique upper and lower surfaces, in which case a cantilevered element embossed by the mold usually has uniformly oblique upper and lower surfaces along most of its length.

Uniformly oblique surfaces are not the only oblique radiation artifacts. For example, a component produced by an oblique radiation process typically has a cross-section that is approximately symmetrical about an oblique central axis, even if unintended material or process variations preclude formation of uniformly oblique surfaces. Variations that could have this effect include warping of a polymer wall due to softening, changes in shape due to light reflection from a substrate, and so forth. Furthermore, an oblique radiation process may be intentionally used in a manner that precludes uniformly oblique surfaces but leaves other oblique radiation artifacts. For example, using a circular mask pattern and rotating angle of exposure around an oblique axis would produce an oblique conical structure.

As noted above, the definition of "uniformly oblique" allows for process limitations. For example, if a layer of negative photoresist such as SU-8 is exposed with an oblique radiation technique and then developed, the resulting polymer component's profile will be slightly reentrant or tapered due to attenuation of radiation within the photoresist; a surface of the polymer component will nonetheless be "uniformly oblique" within the above definition if it would have been uniformly oblique without the slight reentrance or tapering due to process limitations. Other process limitations result in other slight variations from uniform obliqueness, some of which are mentioned herein, but the resulting surfaces or parts are nevertheless "uniformly oblique" within the above definition.

In the example in FIG. 1, second part 114 and surface 104 define an oblique angle with joint 116 at its vertex. Cantilevered elements connected or supported in various other ways are within the scope of the invention. Cantilevered elements with curved portions, for example are described below in relation to FIGS. 24 and 25. FIGS. 2, 4, 21, 24, 26, 27, and 29-36 illustrate variations in which at least one polymer part is supported on a base end.

Each of the microstructures in FIG. 1 also has a "spring-like portion", meaning a portion that returns elastically to substantially its original shape when released after being deformed; this elastic behavior is a materials property. A spring-like portion that includes some or all of a cantilevered element may also have plastic deformation, especially if subject to an extraordinary stress, but across some useful range of stresses its deformation is substantially elastic and can be characterized by an appropriate spring constant. In the ideal case, the product of a spring's spring constant with the distance it is deflected is proportional to the spring force, i.e. force exerted by the spring in response to force causing its deflection, referred to herein as "deflecting force". A spring-like portion or the like is referred to herein as "undeflected" when it is subject to approximately zero deflecting force.

Specifically, when deflecting force toward or away from surface 104 is applied to third part 118 or otherwise to a point along the length of microstructure 110, its spring-like portion is elastically deformed in accordance with its spring constant. When released, the spring-like portion returns toward its initial shape. Ideally, the spring-like portion returns to its initial unstressed shape, although in practical implementations, some plastic deformation may occur.

The spring-like portion of each microstructure in FIG. 1 has "length", meaning distance it extends from its base to its free part, and also has "effective length", meaning distance it extends from its base to where it effectively receives deflecting force in use; for a given instance of deflection, the effective length extends to a position around which deflecting force is balanced, and typically does not exceed the length. Each spring-like portion also has "thickness", meaning distance between its upper and lower surfaces. Each spring-like portion also has "width", meaning lateral distance across its upper and lower surfaces in a direction generally perpendicular to length.

While each of these dimensions may have more than one value for a given spring-like portion, all the values of a dimension may share a given characteristic. In exemplary implementations of the invention described herein, the thickness of each spring-like portion is less than its length, meaning that any measurement of its thickness is less than any measurement of its length. In many implementations, a length-to-thickness ratio of 3 or more is sufficient for a spring-like portion to be appropriately deflected while providing substantial spring force, given a suitable material. In specific implementations, a spring-like portion's thickness might not exceed 10% of its length, similarly meaning that any measurement of its thickness is no greater than 10% of any measurement of its length. A length-to-thickness ratio of 10 or higher is likely to allow much greater possible deflection than a ratio of 3 as discussed above, but will not provide as much spring force. Where the effective length is shorter than the length, similar considerations apply to the ratio of effective length to thickness.

To be useful in a practical application, a cantilevered element's spring-like portion must typically meet certain requirements appropriate to the application. Specifically, it may be required to have deflection and spring force in certain ranges in response to deflecting force that occurs in the application, and such ranges are referred to herein as "required ranges". Several factors affect a spring-like portion's deflection and spring force, including its material structure, its effective length, its thickness, and its width.

In the example of FIG. 1, each microstructure can be used or applied as a "spring cantilever", meaning a cantilever that behaves like a spring. In other words, a spring cantilever has a projecting member supported at only one end, and the projecting member is elastic in that it returns to substantially its original shape when released after being deflected.

Spring cantilevers can be used, for example, in spring contact arrays, described below in relation to FIGS. 18 and 19, or in surface detection arrays, described below in relation to FIG. 20. In these applications, the required ranges of deflection and spring force are based on the necessary movement of the spring cantilever in response to deflecting force and the responsive force necessary to maintain electrical or mechanical contact. For spring contact or surface detection arrays, the required range of deflection may also be based on the movement necessary to ensure that all elements in the array are making good contact at all times.

As described below in relation to FIG. 21, a spring cantilever can also be used to hold an object in position under it. In this and similar applications, the required ranges of deflection and spring force are based on the movement necessary to allow insertion (and possibly removal) of the object and the responsive force necessary to hold the object after insertion.

Deflection and spring force within required ranges can be obtained in various ways. For example, proportions of effective length, thickness, and width can be tested experimentally until satisfactory proportions are obtained for a given material structure.

Figure 2:
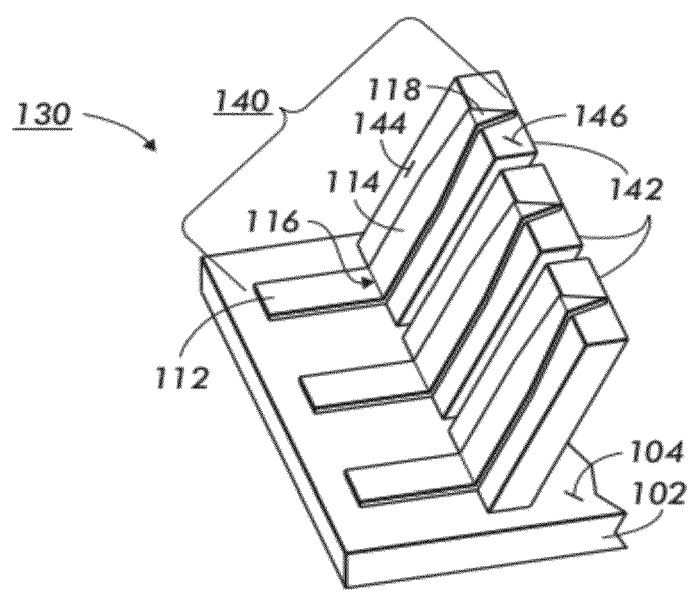
FIG. 2 is a perspective view of another array of microstructures with spring cantilevers with oblique parts that include polymer walls.

FIG. 2 illustrates an alternative exemplary implementation in which a polymer wall affects a cantilevered element's deformation characteristics such as deflection and spring force. As used herein, "polymer" refers to any material that includes one or more compounds formed by polymerization and that has properties resulting from presence of those compounds. Also, as used herein, "wall" means a cantilevered element or a component with upper and lower surfaces that are approximately parallel and with length and width that are both greater than thickness.

In FIG. 2, array 130 again includes a number of microstructures supported on substrate 102. Representative microstructure 140 includes first part 112, second part 114, joint 116, and third part 118 as described in relation to FIG. 1. In addition, microstructure 140 includes polymer wall 142, with an oblique upper surface 144 supporting second part 114 and with a horizontal surface 146 supporting third part 118. In this implementation, polymer wall 142 can be sufficiently thin to be flexible and elastically deformable to an extent, while first part 112, second part 114, and third part 118 can be an electrically conductive material, providing an electrically conductive path from third part 118 to circuitry supported on substrate 102. When the spring cantilever is distorted, polymer wall 142 flexes; second part 114 and third part 118 remain on surfaces 144 and 146, respectively. The ratio of length to thickness for microstructure 140 is illustratively about 4, and the ratio of length to width is illustratively about 2, which are again merely exemplary.

Polymer wall 142, together with surface 104 of substrate 102, provides a mold or form that can be used in producing other components of microstructure 140. It would be possible to form the parts in an appropriate sequence. As described in greater detail below, however, first part 112, second part 114, joint 116, third part 118, and the connection between second part 114 and third part 118 can all be concurrently deposited using plating or other deposition techniques and patterned using photolithographic techniques. Specifically, first part 112 can be deposited on surface 104 or over other layered structures such as contacts and other electrical circuitry on surface 104. Second part 114 can be deposited on upper oblique surface 144, third part 118 on horizontal surface 146, joint 116 at the edge where surfaces 134 and 144 meet, and a similar joint between part 114 and part 118 at the edge where surfaces 144 and 146 meet.

FIGS. 1 and 2 illustrate microstructures with surfaces that include uniformly oblique sections and, more specifically, substantially planar sections. Examples of uniformly oblique sections of surfaces include the lower surface of second part 114 in both figures and upper surface 144 in FIG. 2, all of which extend along approximately the entire length of a cantilevered element's spring-like portion from its base on a support surface 104 to its free part. In some other implementations, a uniformly oblique section of a surface extends approximately 60%, 75%, or 90% of a spring-like portion's entire length, and other variations are possible.

Figure 3:
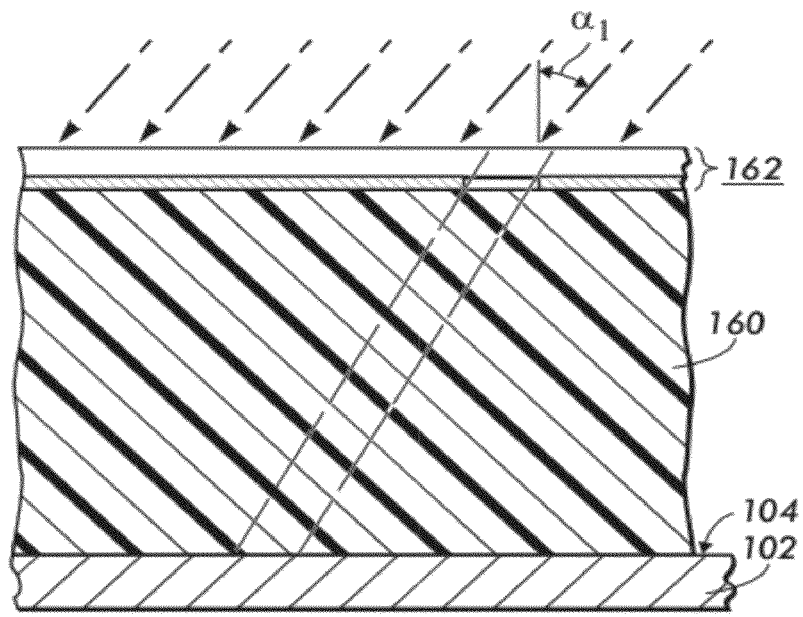
FIG. 3 is a cross-sectional view of a preliminary stage in exemplary techniques that fabricate microstructures with oblique parts, such as those in FIGS. 1 and 2.

FIG. 3 illustrates a preliminary stage in producing a microstructure such as microstructure 110 in FIG. 1 or microstructure 140 in FIG. 2. Substrate 102 can, for example, be a silicon wafer polished on one side or a glass substrate. Prior to the stage shown in FIG. 3, photoresist layer 160 has been deposited on surface 104 of substrate 102. Layer 160 can, for example, be formed of an appropriate photopolymer such as SU-8 from MicroChem Inc. or DiaPlate from HiTech Photopolymere AG, or another photoresist that can be used to produce relatively tall microstructures with high aspect ratios, i.e. high ratios of height to width. SU-8 structures above 1.0 mm in height are feasible and DiaPlate structures up to 0.5 mm in height have been reported. Layer 160 can be deposited to an appropriate thickness, such as between tens and a few thousands of microns.

Because SU-8, for example, is a negative photoresist, regions of SU-8 that are exposed to ultraviolet (UV) light are not removed during subsequent development and removal of unexposed regions. A masking structure 162 placed over photoresist layer 160 illustratively includes a single slot or opening through which light can be projected from a source onto layer 160. If the light is received at the angle $\alpha_1$ from the normal, an exposed portion of layer 160 will extend at an oblique angle $\alpha_2$ that is a function of $\alpha_1$, as described below. Angle $\alpha_1$ should be sufficiently great that errors will not result in vertical structures. An $\alpha_1$ angle no less than approximately 10° should satisfy this constraint, and larger values may be desirable for many applications. As described in relation to FIG. 22 below, angles up to approximately 70° should be obtainable.

Mask 162 can be a conventional glass photomask, directly in contact with layer 160 or with an air gap between the mask and layer 160 as in the proximity mode of exposure. Various other masking schemes could be used, including some in which a glass plate is not present, or, if substrate 102 is transparent, backside exposure through a suitable mask can be used. Of course, a positive photoresist (such as ma-P 100 from MicroResist Technology or AZ 9200, AZP4000, AZ PLP 100XT from Clariant and others) may also be used. With the presently available negative resists, particularly SU-8, higher structures with higher aspect ratios are achievable than with positive resists. In the case of positive photoresist, the exposed area is dissolved during the development process and the mask pattern would be reversed.

Figure 4:
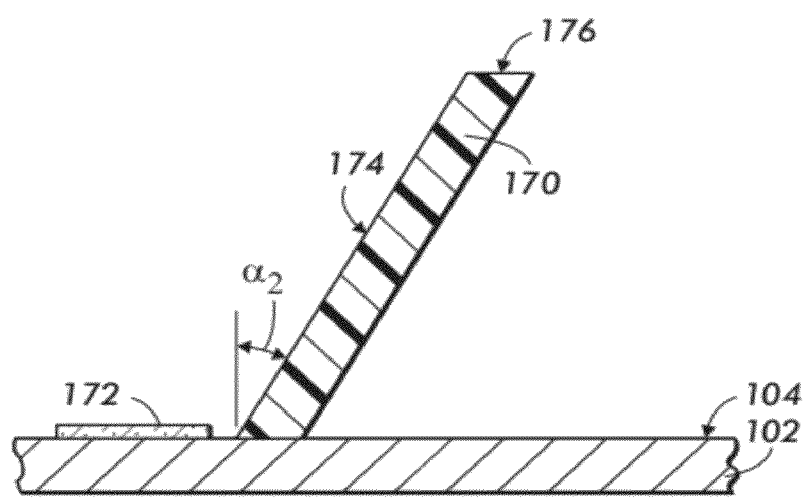
FIG. 4 is a cross-sectional view of a stage following that in FIG. 3.
Figure 5:
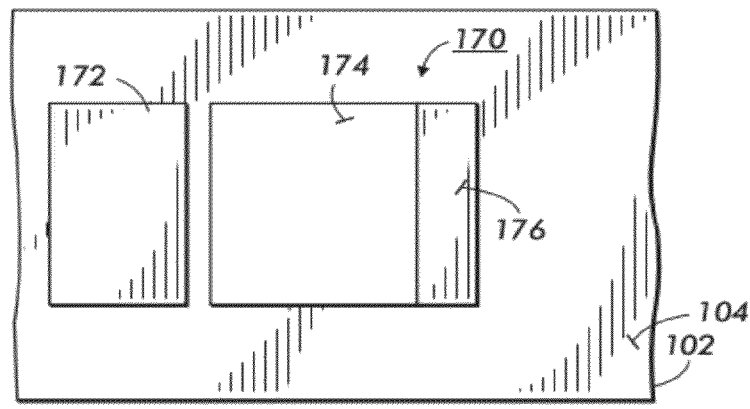
FIG. 5 is a top view of the stage shown in FIG. 4.

After exposure as illustrated in FIG. 3, and after further processing, including development of layer 160 and removal of nonexposed photoresist, the structure shown in FIG. 4 is obtained. In addition to photoresist wall 170 extending at an oblique angle $\alpha_2$ from the normal, surface 104 of substrate 102 supports a conductive contact 172, which can be formed using microfabrication processes before or after photoresist wall 170. FIG. 5 shows a top view of the structure in FIG. 4, illustrating the shapes of upper oblique surface 174 and horizontal surface 176 of photoresist wall 170.

Photoresist wall 170, by itself, can have a thickness that allows it to function as a spring cantilever or spring-like portion of a cantilevered element, with its base end supported on surface 104 and with horizontal surface 176 at its free part. An exemplary thickness is 10 μm, but, in general, the spring constant of a rectangular cantilever is proportional to (width× thickness$^3$/length$^3$); therefore, as wall 170 is longer, its thickness could be greater to maintain the same spring constant. Upper surface 174 can be substantially planar and can extend the entire length if the production process is performed as described above using a suitable mask.

If SU-8 is used to produce photoresist wall 170, the well-known main steps for SU-8 baking and processing can be followed, but with appropriate changes for specific dimensions of wall 170. For example, if wall 170 is produced from a relatively thick layer of SU-8, longer exposure times, higher baking temperatures, and longer baking times can be used to obtain a polymer wall of suitable flexibility.

Figure 6:
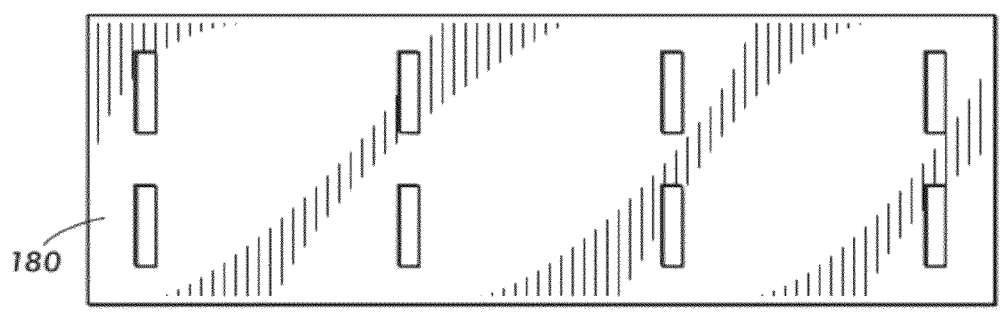
FIG. 6 is a top view of a portion of a mask that could be used in the stage in FIG. 3.
Figure 7:
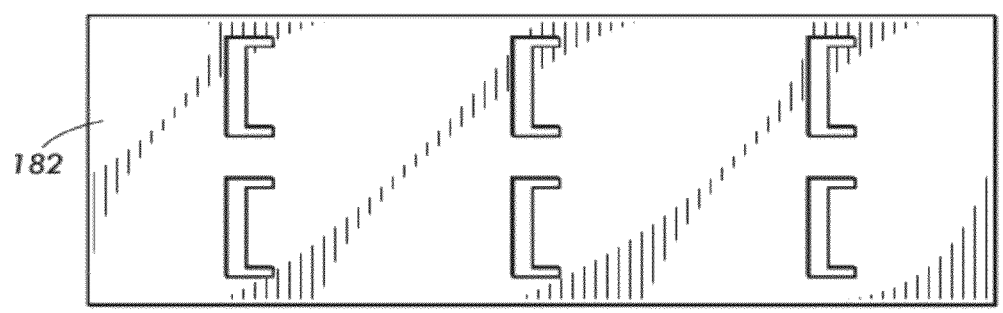
FIG. 7 is a top view of a portion of an alternative mask that could be used in the stage in FIG. 3.

Mask portion 180 in FIG. 6 includes an array of rectangular slots or openings that would produce an array of microstructures like photoresist wall 170 in FIGS. 4 and 5, with substantially planar upper and lower surfaces. Mask portion 182 in FIG. 7 shows an alternative shape for openings that would result in walls with better mechanical stability at small wall-thicknesses, with a substantially planar upper surface but with the lower surface being U-shaped. Masks such as those illustrated in FIGS. 6 and 7 and various other suitable masks could be used either for frontside or backside exposure of photoresist layer 160, assuming a transparent substrate material is used.

Structures similar to FIGS. 4 and 5 could also be produced using various other exposure techniques, such as using X-rays to expose a polymer such as polymethyl methacrylate (PMMA) or using oblique laser direct exposure of photoresist. Furthermore, such structures could be produced by oblique laser ablation of a polymer. The structures could also be produced by an embossing or molding technique in which an insert mold has an oblique pattern produced by any suitable exposure technique, as discussed in relation to FIG. 23, below.

Figure 8:
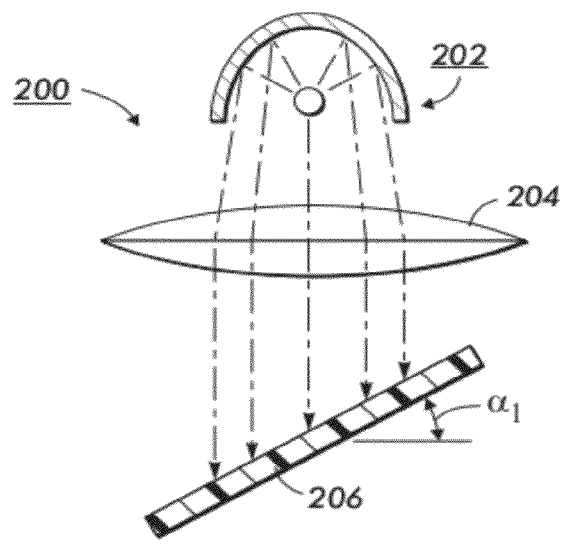
FIG. 8 is a schematic optical illustration of an exposure system that could be used in the stage in FIG. 3.
Figure 9:
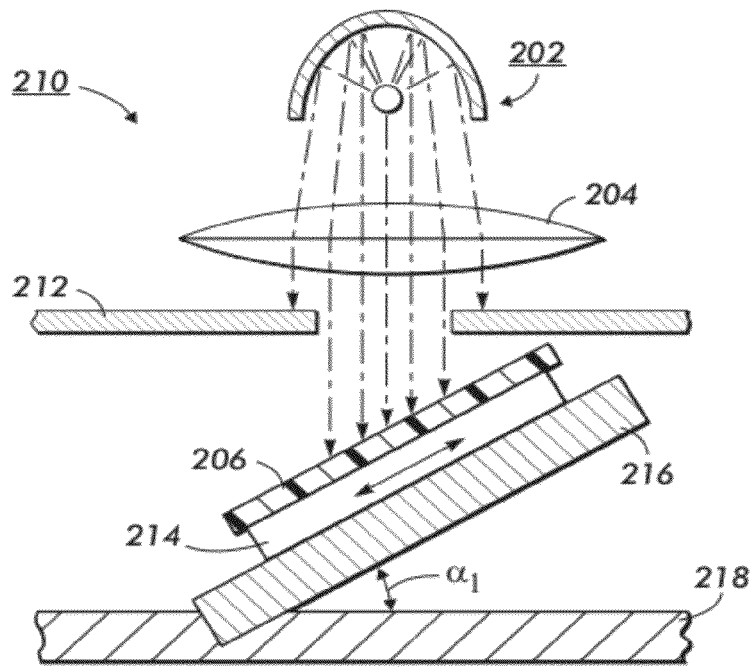
FIG. 9 is a schematic optical illustration of another exposure system that could be used in the stage in FIG. 3.

FIGS. 8 and 9 show exposure systems 200 and 210, either of which can be used in the stage illustrated in FIG. 3 or to produce an insert mold. Unlike conventional UV exposure systems, which are engineered for exposure perpendicular to a substrate, exposure systems 200 and 210 expose a photoresist layer at an angle other than perpendicular.

Exposure system 200 is a very simple system with light source 202 and collimator 204. Collimated light from collimator 204 reaches wafer assembly 206, which can include substrate 102, photoresist layer 160, and mask structure 162 as shown in FIG. 3. As shown, the central plane of wafer assembly 206 is tilted in relation to the wave plane of the collimated light by the angle $\alpha_1$.

In exposure system 210, light source 202 and collimator 204 can be implemented as in exposure system 200. In addition, aperture 212 provides a small beam width for light reaching wafer assembly 206. Wafer assembly 206 is mounted on a speed-controlled movable support 214 that moves relative to a stationary support 216. Stationary support 216 is in turn mounted on table 218 at an angle of $\alpha_1$. In comparison with system 200, system 210 eliminates exposure non-uniformity due to differences in distance between light source 202 and the surface of wafer assembly 206. Exposure system 210 also allows scaling of the exposure process to large-area substrates more easily.

Various other techniques could be used with these and other exposure systems. See, for example, Han, M. H., Lee, W. S., Lee, S.-K., and Lee, S. S., "Fabrication of 3D Microstructures with Single uv Lithography Step", J. of Semiconductor Technology and Science, Vol. 2, No. 4, December, 2002, pp. 268-272, incorporated herein by reference.

Figure 10:
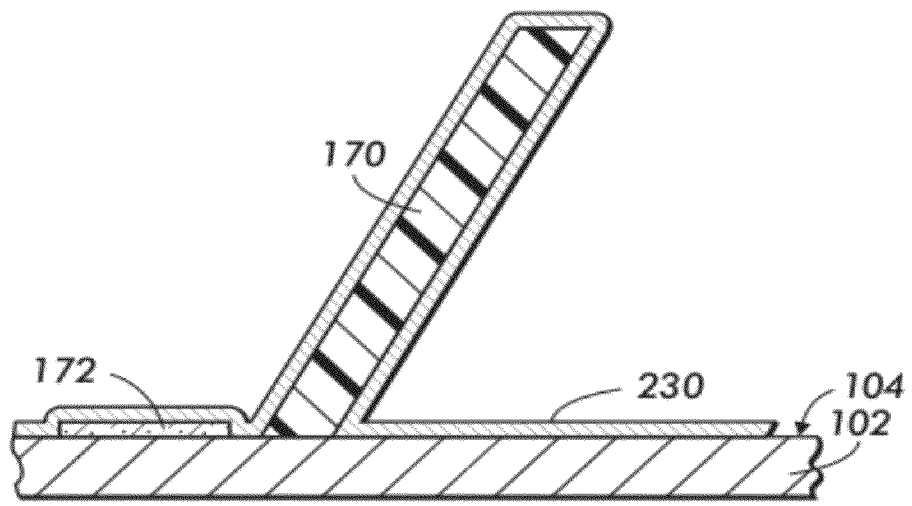
FIGS. 10-12 are successive cross-sectional views of stages following that in FIG. 4.

FIG. 10 shows a stage following the stage in FIG. 4, showing how wall 170 functions as a mold. Seed layer 230 is illustratively deposited over the entire surface of the structure; in some techniques, wall 170 may have a shadowing effect, in which case surfaces under wall 170 would not be covered by seed layer 230. Seed layer 230 can be a thin layer of an appropriate metal, metal alloy, or other seed material on which material can be deposited by plating, such as by electroless plating, electroplating, or other electrodeposition. For example, seed layer 230 could be a thin sputtered layer of titanium followed by gold (Ti/Au) with a total thickness between 50-100 nm or a thin layer of copper or nickel of similar thickness.

Figure 11:
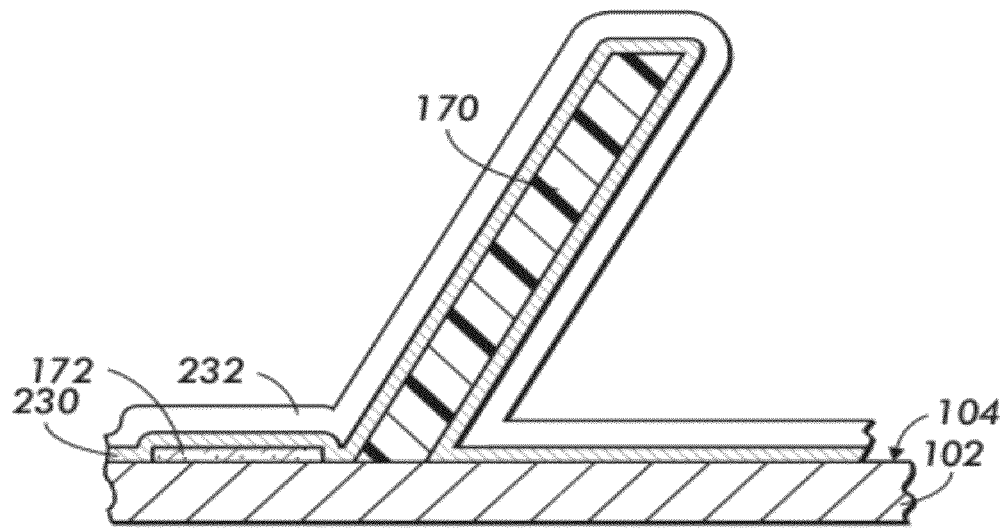

FIG. 11 shows a following stage in which thin photoresist layer 232 is deposited over seed layer 230. Photoresist layer 232 must be suitable for the high topography of the structure. For example, photoresist layer 232 could be an electrodeposited photoresist such as an Eagle resist from Shipley Ronal or a spray coated photoresist.

Photoresist layer 232 is exposed through a suitable photomask defining the shape of the microstructure to be produced. After development, the part of layer 232 where the microstructure is to be deposited is removed to expose seed layer 230, as shown in the stage in FIG. 12. Because of the upward projection of cantilever-like photoresist wall 170, photolithography may vary in accuracy, with higher accuracy near the top of wall 170 than at the surface 104 of substrate 102, depending on the total distance between the photomask and the substrate and on the collimation of the light source. To reduce reflections from oblique photoresist walls, linearly polarized light may be used.

Figure 12:
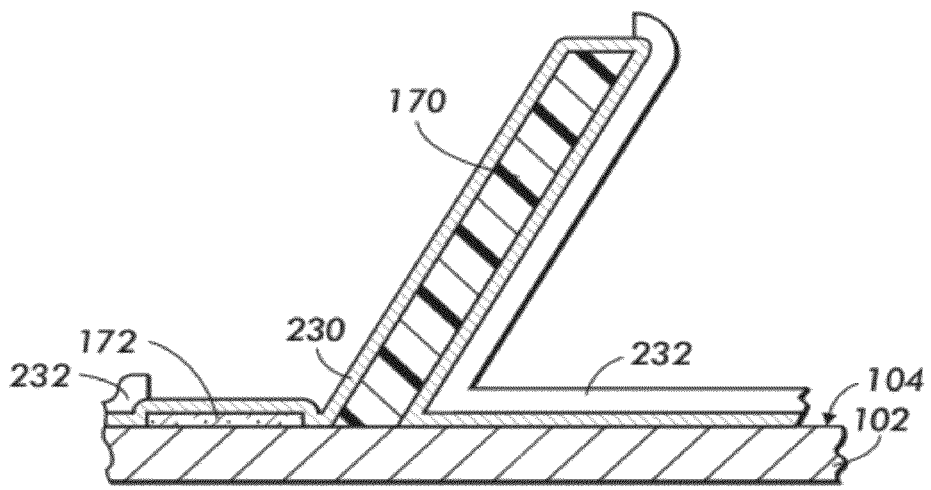
Figure 13:
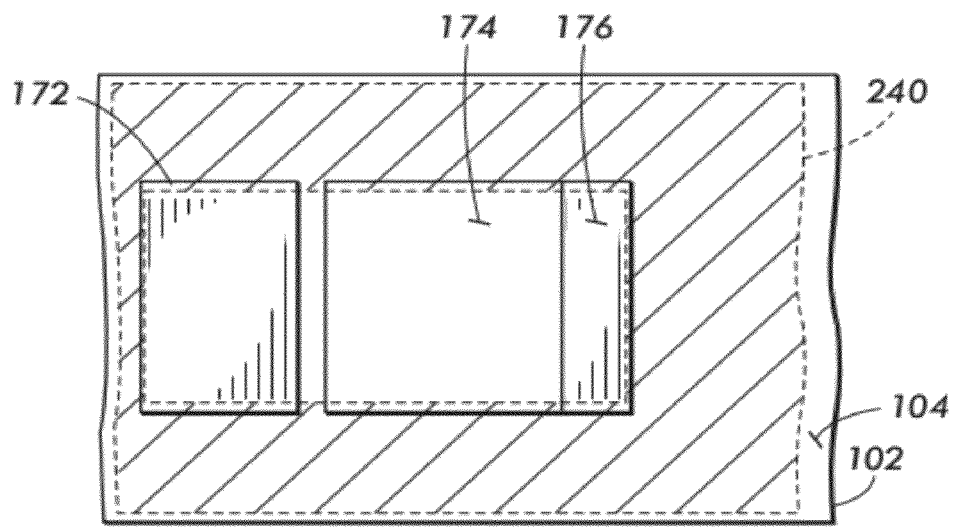
FIG. 13 is a top view of an exemplary implementation of the stage shown in FIG. 12.

FIG. 13 shows an exemplary pattern for photoresist layer 232 in FIG. 12, for an implementation to produce a single microstructure. In FIG. 13, photoresist pattern 240 has a rectangular opening over contact 172, oblique upper surface 174, and horizontal surface 176. The rectangular opening could be used to produce a rectangular microstructure.

Figure 14:
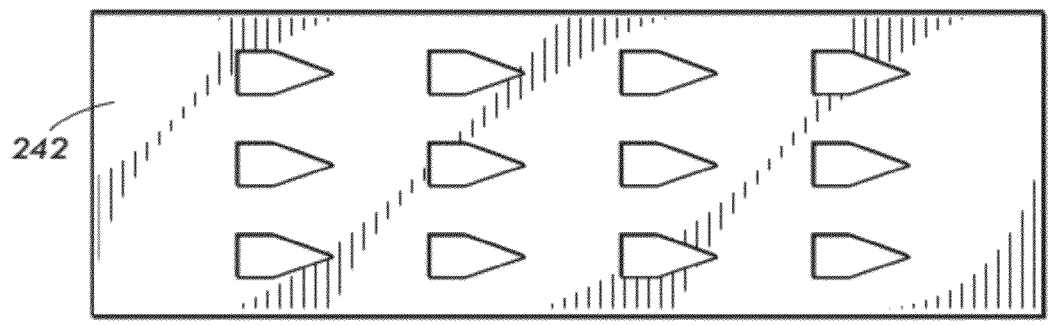
FIG. 14 is a top view of a portion of a mask that could be used in the stage in FIG. 12.
Figure 15:
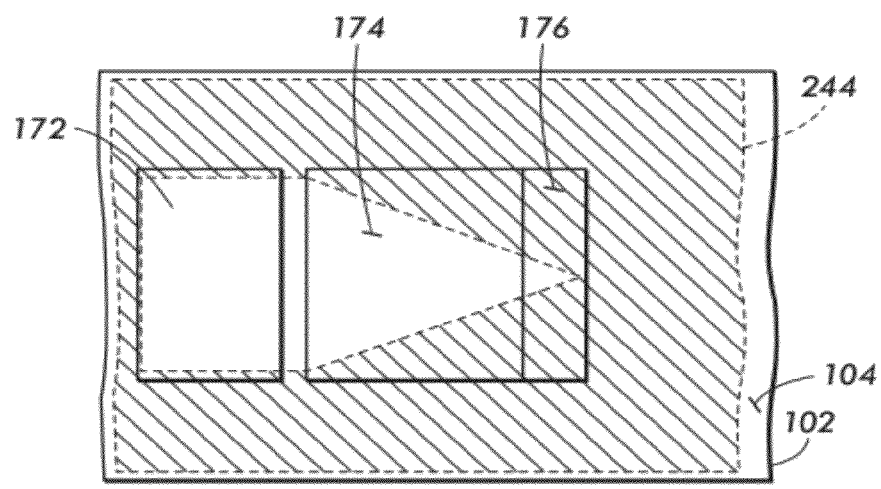
FIG. 15 is a top view of an alternative exemplary implementation of the stage shown in FIG. 12, produced using a mask similar to that in FIG. 14.

FIG. 14 shows portion 242 of a mask that could be used to produce microstructures with shapes as in FIGS. 1 and 2. FIG. 15 is similar to FIG. 13, but shows photoresist pattern 244, in which the opening tapers between contact 172 and horizontal surface 176 due to use of a mask similar to portion 242 in FIG. 14, producing a tip similar to third part 118 in FIGS. 1 and 2. The mask portion 242 could be moved leftward in relation to substrate surface 104 in order to obtain a tip without a horizontal part; in other words, second part 114 in FIGS. 1 and 2 could come to a point rather than being connected to a third part parallel to surface 104.

Figure 16:
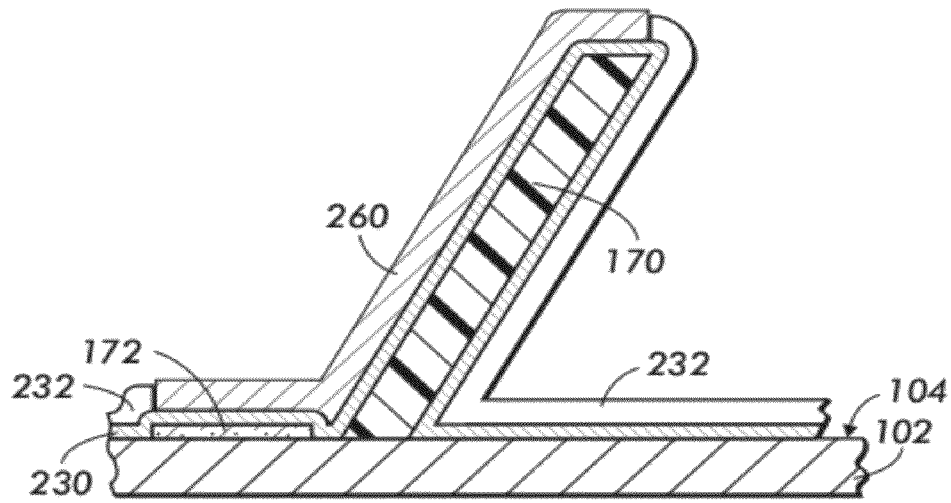
FIGS. 16 and 17 are successive cross-sectional views of stages following that in FIG. 12.

FIG. 16 shows a stage that follows deposition of material upon exposed portions of seed layer 230 in FIG. 12. This deposition could be done in various ways. In particular, electroplating or electroless plating could suitably produce structure 260 with any appropriate combination of metals such as nickel, nickel phosphorus, copper, and gold, plated in consecutive layers to a total thickness of 1-10 μm or more. Structure 260 could also be produced by coating or plating with a solder material such as lead-tin (PbSn) or with a magnetic material such as NiFe. The shape of structure 260 will depend, of course, on the photoresist pattern, which may be as in either of FIG. 13 or 15 or any other appropriate pattern.

If the material for structure 260 is deposited by a method such as sputter coating or evaporation, then the patterning of structure 260 could be done by a lift-off technique (in this case the deposit on photoresist layer 232 could be "lifted off" when dissolving the photoresist) or by etching of the deposit in the unwanted areas (in this case the shape of structure 260 would have to be protected by a layer of patterned photoresist). In these techniques, seed layer 230 would not be necessary. Various other materials could be deposited, including, for example, materials that are hard to plate, such as aluminum or metal oxides such as titanium dioxide, vanadium oxide, and so forth.

After the stage in FIG. 16, the remaining part of photoresist layer 232 can be stripped away with conventional techniques. Then seed layer 230 can be etched away wherever it is exposed by removal of photoresist layer 232. This will leave a structure like microstructure 140 in FIG. 2. Then, if desired, photoresist wall 170 can be removed using an appropriate etchant, solvent, or a plasma process. This will produce microstructure 270, shown in the stage in FIG. 17. Because of its spring-like properties, microstructure 270 may be referred to as a "microspring." With the illustrated dimensions, microstructure 270 has a substantially planar lower surface that extends approximately 90% of the length from surface 104 to the top surface of the free part; it may be possible to obtain a substantially planar surface that is nearly 100% of the length, such as with a length of 100 μm and a thickness of 1-5 μm.

Microstructure 270 and similar structures produced as described above can be used in various applications in which spring-like, resilient, elastic, or bendable microstructures are useful. In particular, a high density array of such microstructures can be useful in a probing or packaging application, such as for high-density probe contacts as in probe cards, for microchip to printed circuit board interconnects, for microscopic surface sensing, or for surface-based data storage. In comparison with some previous techniques, microstructure 270 does not require stress engineering to move it out of the plane of its support structure. Also, the surface area required for fabrication of each such microstructure in an array is very small, and not significantly greater than its projection onto the surface on which it is fabricated, allowing denser packing within an array than some previous techniques. The above technique for producing microstructures can be described as an inherently additive three-dimensional process, in contrast with processes that map structures from two-dimensions to three-dimensions and therefore require more surface area for fabrication.

Figure 18:
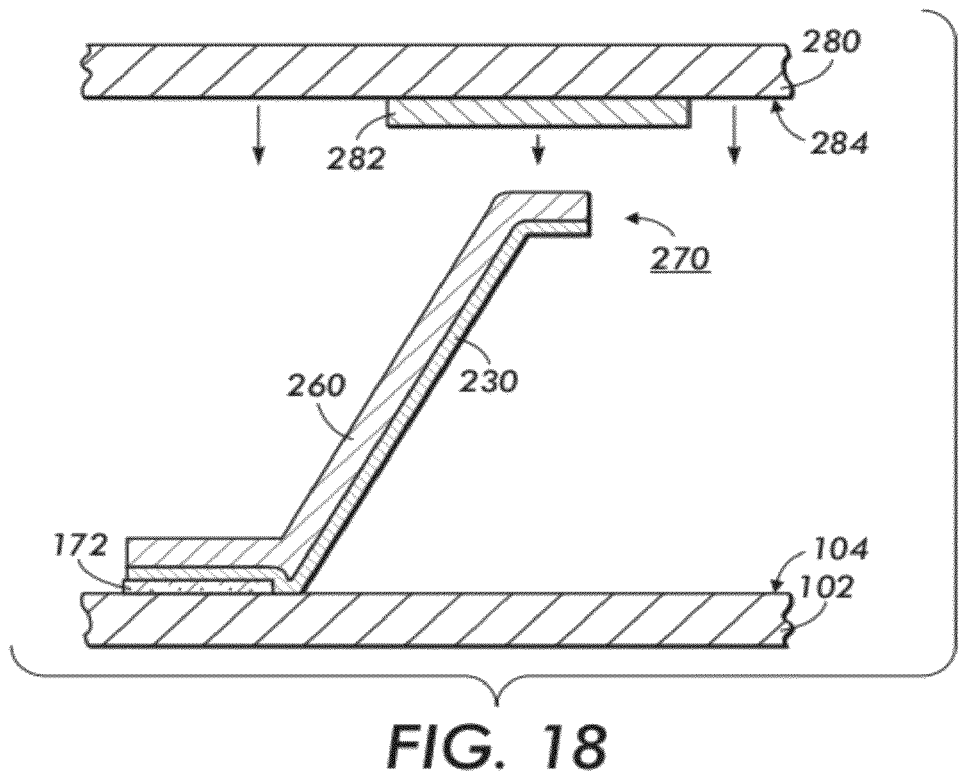
FIGS. 18 and 19 show two stages in an application of the microstructure shown in FIG. 17.
Figure 19:
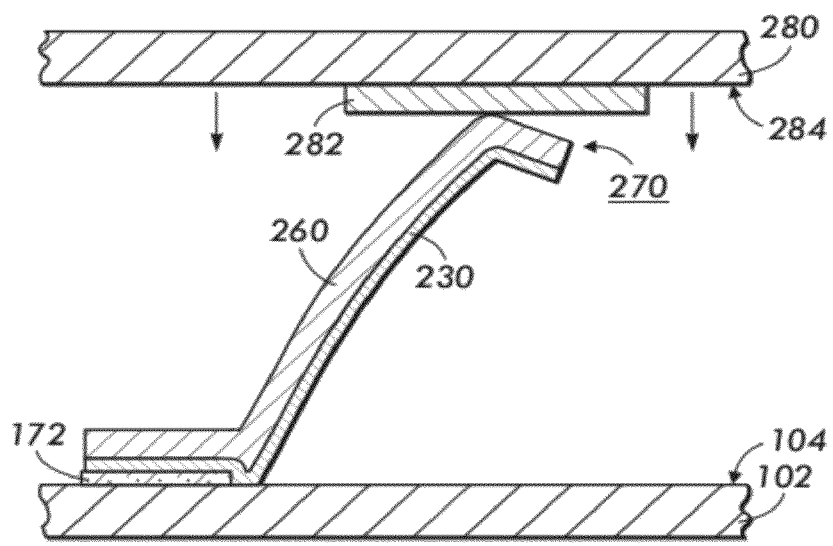

FIGS. 18 and 19 illustrate application of microstructure 270 to provide a contact pin. In FIG. 18, microstructure 270 is positioned below substrate 280. Contact 282 on surface 284 of substrate 280 is positioned above microstructure 270. As indicated by the black arrow, substrate 280 is moving toward substrate 102. FIG. 19 shows that mechanical (and therefore electrical) contact has been made between contact 282 and microstructure 270. As a result of deforming force or stress exerted by contact 282 on the upper surface of microstructure 270, microstructure 270 is deflected so that its position is responsive to the position of contact 282. If plated structure 260 is conductive, microstructure 270 will provide a conductive path between contacts 172 and 282. This makes it possible to connect circuitry on substrates 102 and 280.

As suggested in FIG. 19, the effect of the deforming force or stress is to change the shape of the spring cantilever of microstructure 270. No substantial change in shape occurs in the free part, but some curvature occurs in the area of the second part midway between the free part and the first part. The spring cantilever resiliently resists the deforming force or stress, ensuring that a good electrical connection is maintained where the third part of microstructure 270 is touching contact 282. Alternatively, a bump of solderable material such as lead-tin on the third part of microstructure 270 could be used to make permanent electrical contact once initial contact is made.

Figure 20:
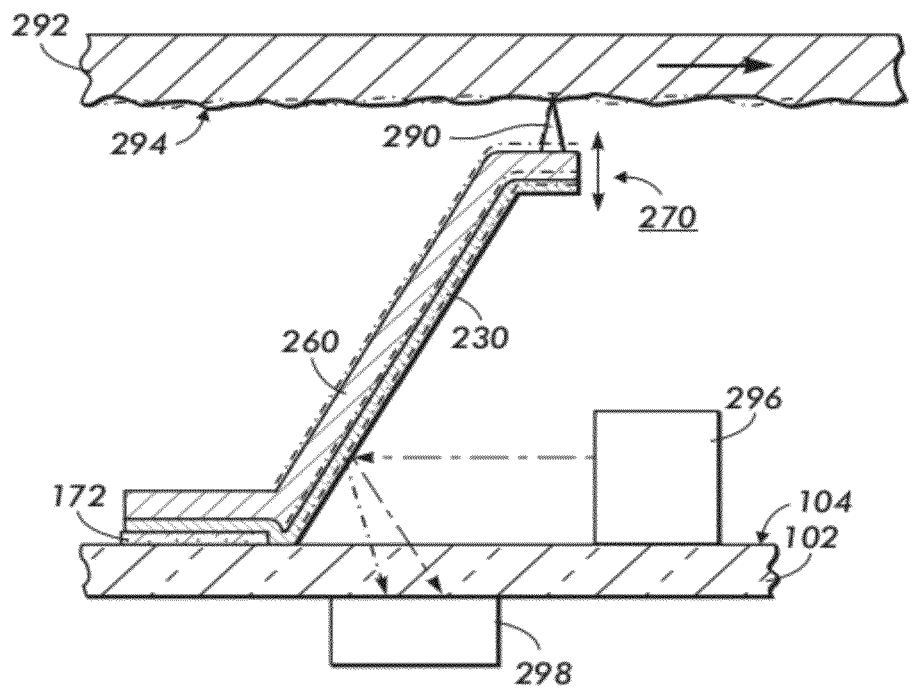
FIG. 20 shows another application of the microstructure shown in FIG. 17.

FIG. 20 illustrates another application of microstructure 270, applicable to tips used in an atomic force microscope (AFM), a scanning tunneling microscope (STM), in AFM/STM data storage, or in other applications in which surface features are detected. Microstructure 270 has an additional tip 290 which could be a deposited nanowire, a deposited tungsten tip, a deposited diamond grain, or other appropriate structure; various techniques for providing tip structures are described, for example, in U.S. Patent Application Pub. No. 2003/0199179-A1 and in Baselt, D., "Atomic force microscopy—Measuring intermolecular interaction forces", published at the Web site stm2.nrl.navy.mil/how-afm/how-afm-.html, both of which are incorporated herein by reference.

In use, sample 292 is moved relative to substrate 102, so that tip 290 makes contact (or is in close contact, such as in the non-contact AFM mode) with surface 294 of sample 292; this contact is maintained by spring force. When microstructure 270 is deflected in the manner suggested by the phantom lines in FIG. 19, its position responds to the position at surface 294. Therefore, a laser beam from laser source 296 is reflected at a slightly different angle by seed layer 230 on the lower oblique surface of microstructure 270. As a result, detector 298 detects the laser beam at a slightly different position, and provides an appropriate signal indicating the change in position and therefore providing information about features of the surface 294 of sample 292.

In the applications in FIGS. 18-20, downward deflecting force is applied to each spring cantilever in an array. In response, each spring cantilever's free part moves to a position resulting from deflection but, due to its spring force, maintains contact with the object or surface providing deflecting force. In these applications employing arrays, it is also important that each spring cantilever's deflection be sufficient that all spring cantilevers can be deflected despite any difference in their heights.

A similar application of microstructure 270 is in the field of sensors and actuators. If the structure 270 contains magnetic materials, the structure may deflect in the presence of a magnetic field. This deflection may be detected in a way similar to the one shown in FIG. 20 employing laser beams. In this way, the structure 270 would be a detector for magnetic fields. The deflection of the structure 270 in magnetic fields (when containing magnetic materials) may also be used for actuator applications. For example, if microstructure 270 were both magnetic and electrically conductive, a magnetic field could deflect it in a way to open or close a contact such as in a microswitch. Or magnetic arrays of such microstructures may be applied to ciliary actuation as described in Suh, J. W., Darling, R. B., Böhringer, K.-F., Donald, B. R., Baltes, H., and Kovacs, G. T. A., "CMOS Integrated Ciliary Actuation Array as a General-Purpose Micromanipulation Tool for Small Objects," *J. of Microelectromechanical Systems*, Vol. 8, No. 4, December 1999, pp. 483-496.

Figure 21:
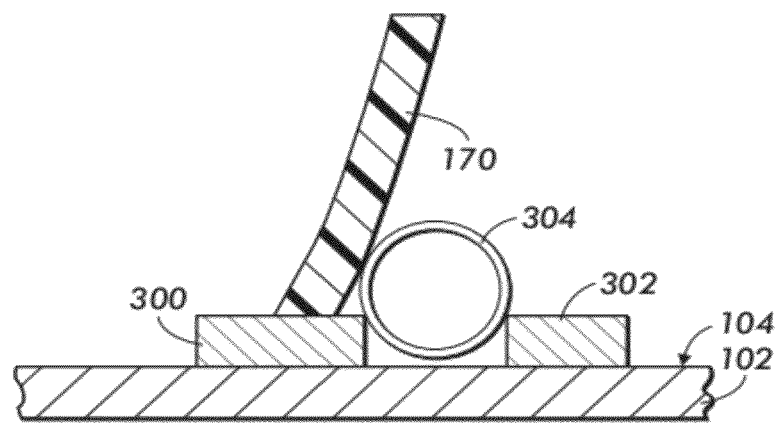
FIG. 21 is a cross-sectional view of another application that could employ a microstructure like that shown in FIG. 4.

FIG. 21 illustrates another application, in which microstructure 170 is optionally formed on alignment block 300 or could be formed directly on surface 104. Another alignment block 302 is formed in the same layer as block 300. Microstructure 170 and blocks 300 and 302 are positioned so that object 304, which could be an optical fiber, a capillary tube, a conductive wire, or another such approximately round object, is held in place by the sidewalls of blocks 300 and 302 (or, if block 300 is omitted, by the sidewall of block 302 alone) after being laterally inserted from the right in FIG. 21. During insertion, object 304 applies deflecting force away from surface 104 to the lower surface of microstructure 170, but the deflection is sufficient to allow insertion. As a result of insertion, some curvature occurs in the portion of microstructure 170 between block 300 and the point of contact with object 304. After insertion, the spring force is sufficient to hold object 304 in place.

As described below in relation to FIGS. 26-36, various other arrangements could be used in similar applications, such as arrangements with two opposing microstructures or without alignment blocks as shown and arrangements with microstructures extending in length across surface 104. Microstructure 170 could have a deposited layer on it as shown in FIG. 2, and other implementations could be used, such as those in FIGS. 1 and 17. Because of the clip-like nature of this application, it is referred to as a "microclip."

Figure 22:
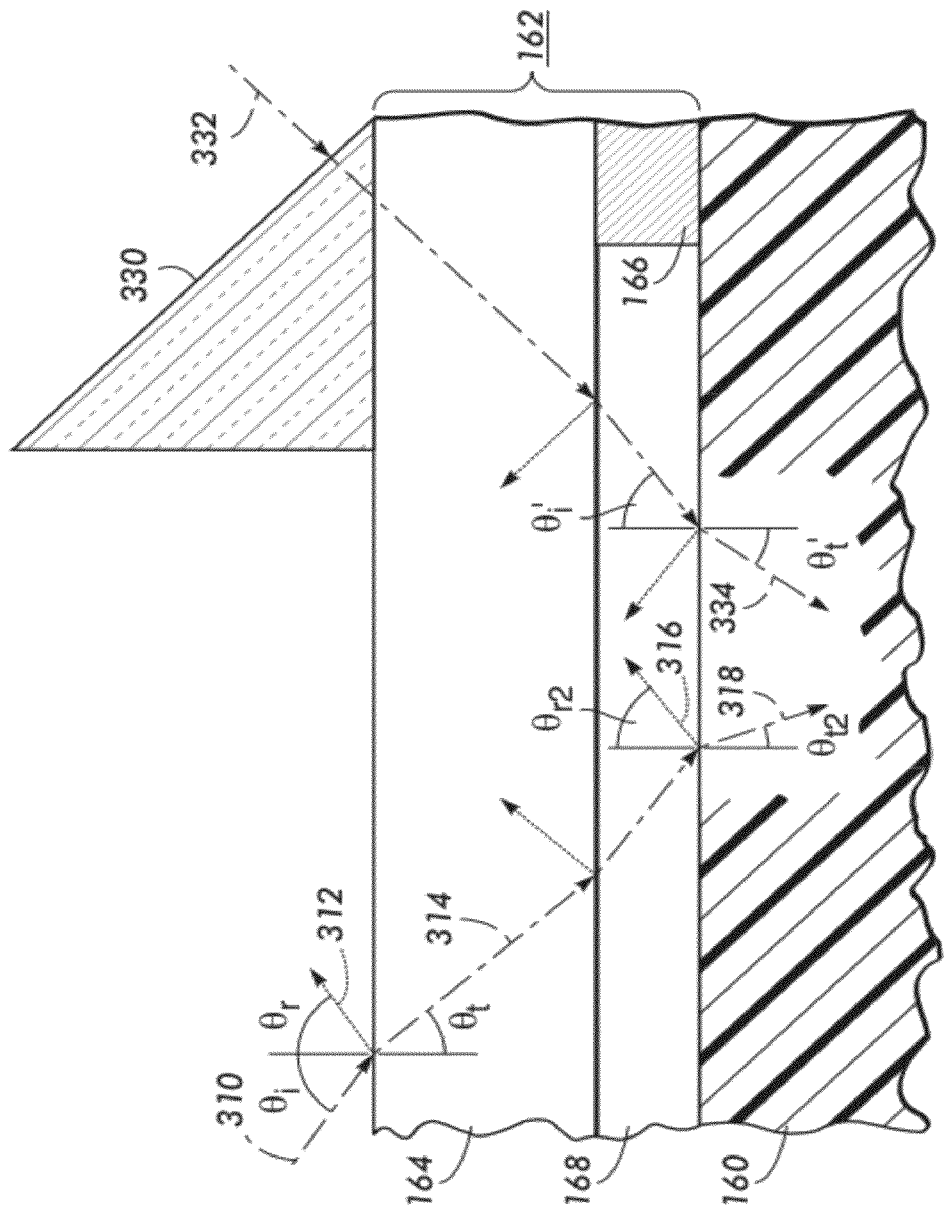
FIG. 22 shows ways in which the angle of illumination during the stage shown in FIG. 3 could be modified.

FIG. 22 illustrates in more detail how a desired oblique angle can be obtained during the stage illustrated in FIG. 3. As shown, light beam 310 is incident upon masking structure 162, with glass plate 164, opaque region 166, and transparent region 168 filled with air or an index-matching fluid. The angle of incidence is $\theta_i$ from the normal, resulting in a reflected beam 312, at an equal and opposite angle $\theta_r$ from the normal. In addition, transmitted light beam 314 travels through glass plate 164 at an angle $\theta_t$ to the normal, and $\theta_t$ can be calculated from $\theta_i$ in accordance with Snell's Law.

Transmitted beam 314, in turn, is similarly divided at the surface between glass plate 164 and transparent region 160. The resulting transmitted beam is again divided between reflected beam 316 and transmitted beam 318 at the surface between mask structure 162 and photoresist layer 160. Reflected beam 316 is at an angle $\theta_{r2}$ from the normal and transmitted beam 318 is at an angle $\theta_{t2}$ from the normal.

In the arrangement shown in FIG. 22, if we neglect the effect of transparent region 168, a theoretical upper limit for the angle $\theta_{t2}$ can be calculated using the maximum incidence angle $\theta_i$ of 90° and the refractive indices of air ($n_{air}$=1), glass ($n_{glass}$=1.5), and SU-8 ($n_{su-8}$=1.6):

$$n_{air} \cdot \sin \theta_i = n_{glass} \cdot \sin \theta_t \rightarrow \theta_t = 41.8°;$$

$$n_{glass} \cdot \sin \theta_t = n_{su-8} \cdot \sin \theta_{t2} \rightarrow \theta_{t2} = 38.7°.$$

Although this maximum angle for obliqueness of photoresist walls compares favorably to the side wall angle that can be achieved in other microfabrication methods (such as anisotropic etching of silicon, i.e., 35.3°), FIG. 22 also illustrates another technique for obtaining higher angles of obliqueness.

As shown at right in FIG. 22, prism 330 can be used to achieve a greater exposure angle for photoresist layer 160. Prism 330 can be optically matched to glass plate 164, and an appropriate index matching fluid may be used at the surface between prism 330 and glass plate 164 to achieve optimal optical index matching across the interface. In this case, with incident light beam 332 arriving at an angle $\theta_i'$ from the normal, and with transmitted light beam 334 continuing at an angle $\theta_t'$ from the normal, the theoretical upper limit for $\theta_t'$, calculated in the same manner as above, increases to 69.6°, because the only significant refraction occurs at the interface between structure 162 and photoresist layer 160. In other words, angles as great as approximately 70° could be obtained with this technique.

In either approach, with or without prism 330, reflections off the substrate or at other surfaces may be a problem. This problem may be alleviated by using antireflection coatings, polarized light, or other appropriate techniques. More generally, various other modifications in the arrangements illustrated in FIGS. 3, 8, 9, and 22 may be made to obtain a desired angle of exposure in photoresist layer 160. For example, laser direct exposure at an oblique angle could be performed as described at the Web site people.bu.edu/xinz/pdf/MRS2003_fall-grace.pdf.

Figure 17:
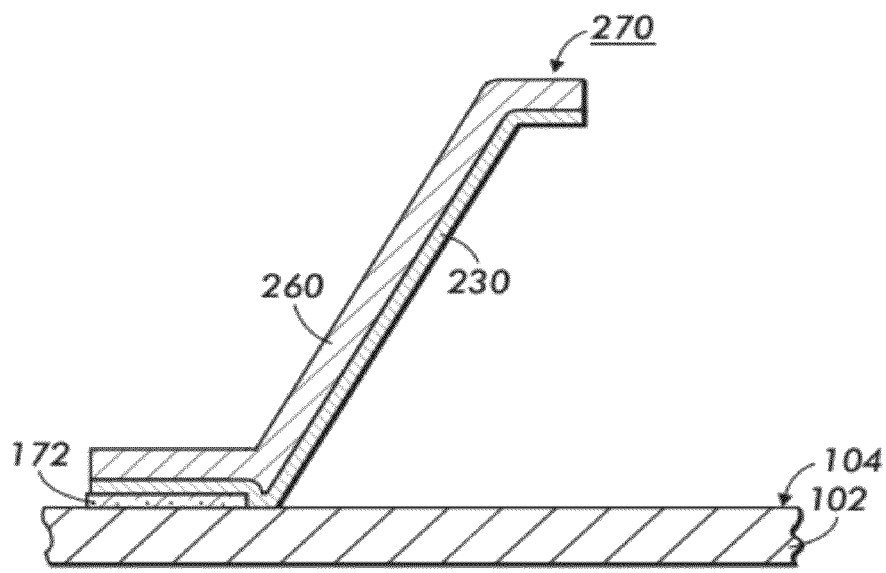
Figure 23:
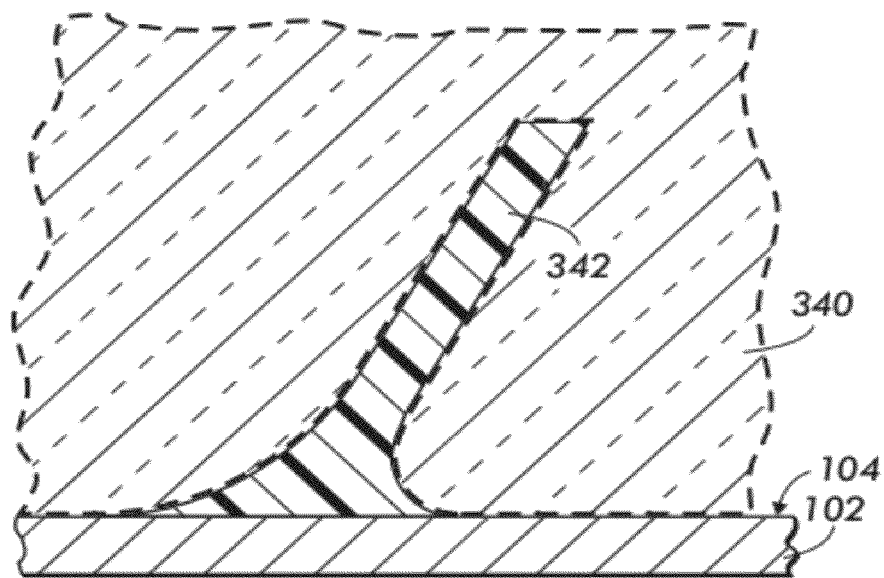
FIG. 23 shows a cross-sectional view of a stage that is an alternative to the stage shown in FIG. 3.
Figure 24:
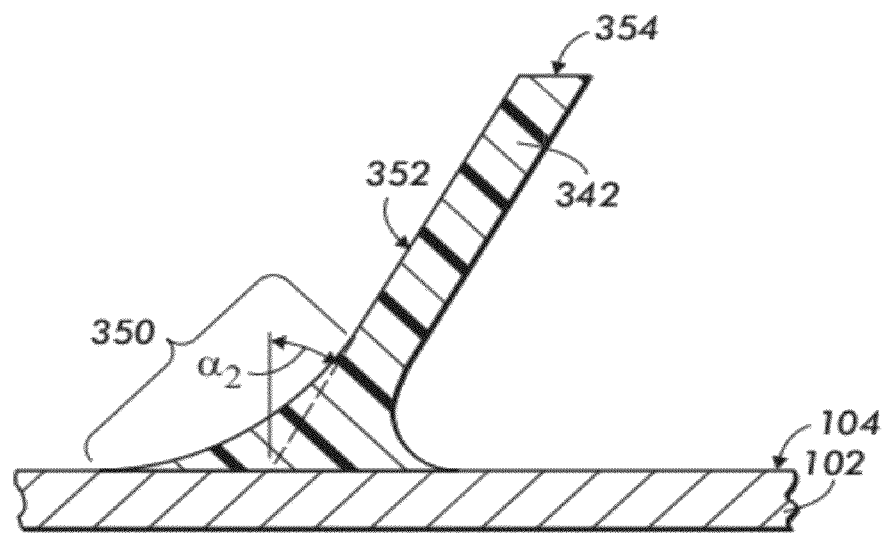
FIG. 24 shows a cross-sectional view of a stage that is an alternative to the stage shown in FIG. 4.
Figure 25:
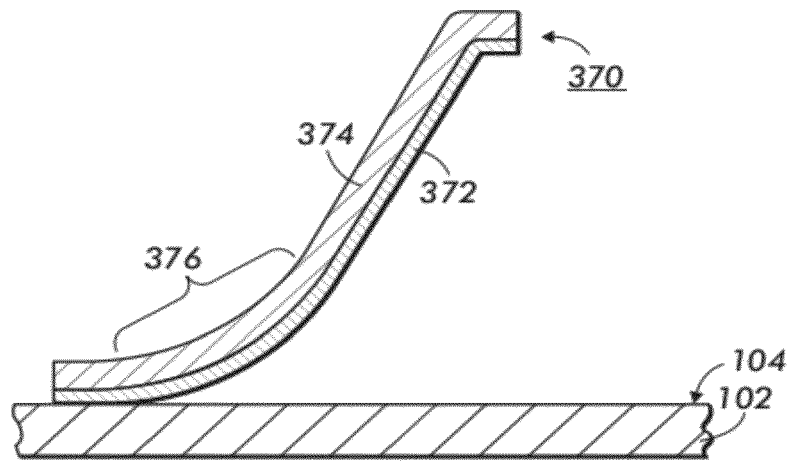
FIG. 25 shows a cross-sectional view of a stage that is an alternative to the stage shown in FIG. 17, based on features of the stage in FIG. 24.

FIGS. 23-25 illustrate other modifications in the process of producing wall 170 and microstructure 270. As shown in FIG. 17, the joint between the first and second parts of microstructure 270 is the vertex of an angle. An angular joint as in FIG. 17 concentrates stress when a distorting force or stress is applied to the second part of the microstructure. As a result, cracking may occur at the connection region, and the microstructure may fail. In general, however, a spring cantilever's connection to a base can have any appropriate shape and other shapes may reduce risk of failure.

In FIG. 23, insert mold 340 has been used to form polymer wall 342 from a layer of polymer material by a molding or embossing technique similar to the one described in Madou, M., *Fundamentals of Microfabrication*, Boca Raton, CRC Press, 1997, pp. 301-302. Insert mold 340 could be produced as described above in relation to FIGS. 3 and 4, using oblique photoresist exposure, and could be applied and removed at an appropriate angle. To obtain curved edges, appropriate additional operations such as thermal reflow or plasma etching could be performed on the insert mold before insertion. After insert mold 340 is removed, reactive ion etching could be performed to remove polymer material if appropriate.

In FIG. 24, polymer wall 342 includes a ramp section 350 at its base, where the upper surface of polymer wall 342 is curved rather than planar. Ramp section 350 extends from substantially planar section 352 of the upper surface to surface 104 of substrate 102. A curved part similar to ramp section 350 could also be produced from photoresist wall 170 in FIG. 4 by filleting in any of a number of ways, including partial reflow or incomplete development of photoresist layer 160. Polymer wall 342 can function as a spring cantilever by itself or with a deposited layer on it, and can also serve as a mold or form for production of a spring cantilever, as described below. The substantially planar section of the upper surface of wall 342 illustratively extends along approximately 75% of its length from substrate 104 to top surface 354.

FIG. 25 shows microstructure 370, with seed layer 372 and structure 374, respectively resembling seed layer 230 and structure 260 of microstructure 270 in FIG. 17 but with its shape modified by ramp section 350. The spring cantilever of microstructure 370 includes curved section 376 with a curved shape resulting from and following the curvature of ramp section 350. This curved shape distributes stress over a larger region than with an angular joint as in FIG. 17, greatly reducing the risk of cracking between the first and second parts of microstructure 370, even though curved section 376 deforms. The substantially planar section of the lower surface of microstructure 370 illustratively extends along approximately 60% or less of its length from substrate 104 to the free part or end.

Techniques as described above could be applied in various applications, including, in general, applications in which microstructures that are spring-like, resilient, elastic, or bendable are useful, such as packaging and probing.

Some of the above exemplary implementations involve arrays of microstructures, but the invention could be implemented with a single microstructure, with or without a support structure. In addition, the techniques described above in relation to FIGS. 1-25 can also be applied to walls or wall-like structures that are larger than microstructures; in particular, the cross-sections of FIGS. 3, 4, 10-12, 16, 17, 21, and 23-25 could be cross-sections of walls or wall-like structures. As used herein, a "wall-like structure" is either a wall or a structure similar to a wall that does not fit the above definition of a wall because of a minor difference, such as that its thickness in places exceeds either its length or its width, or that, due to openings, gaps, or irregularities of some other sort, its length or width in places is less than its thickness, or that it is supported in such a way that it does not fit the above definition of a cantilevered element or the like.

Figure 26:
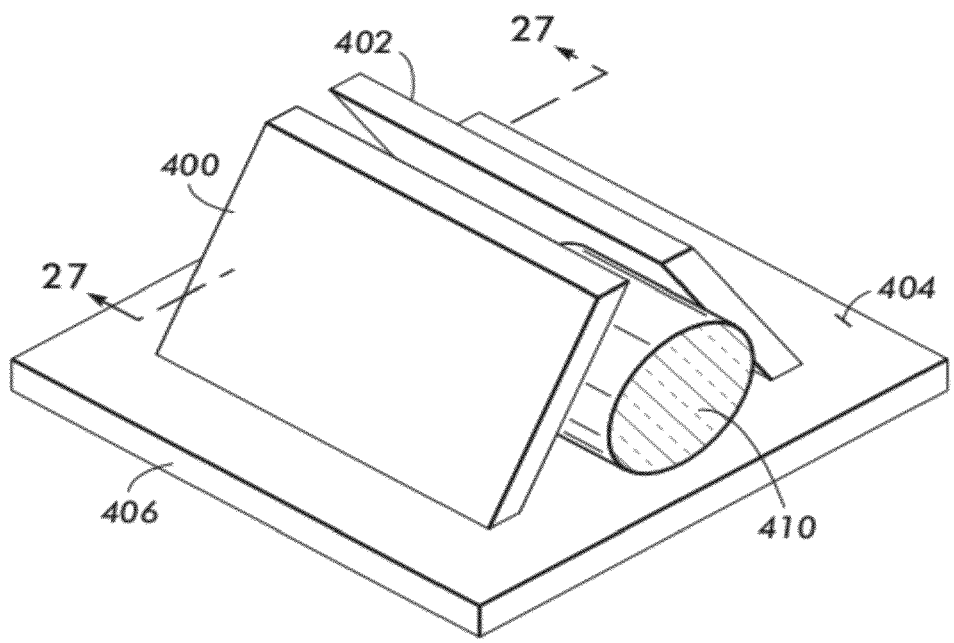
FIG. 26 shows a perspective view of an apparatus in which oblique wall-like structures hold an object.

FIG. 26 shows a pair of oblique wall-like structures 400 and 402 that extend from their bases on support surface 404 of substrate 406 toward each other. Structures 400 and 402 illustratively function as clips, holding tubular object 410 between their lower surfaces and support surface 404. Tubular object 410 could, for example, be an optical fiber (such as in an optical detection application for fluorescence or absorption), a microfluidic capillary tube, or a conductive wire, for example. In many such applications, precise alignment is required, such as between an optical fiber and an on-chip device such as a laser, lens, or optical waveguide, and the technique of FIG. 26 may provide a precise, low-cost approach.

Structures 400 and 402 can have widths and heights appropriate to the diameter of object 410 and to the spring force required to hold object 410 in place after insertion without gluing or other additional measures. As noted above, SU-8 can be produced with a height of up to 2 mm under vertical exposure. Therefore, a 2 mm wall at an angle of 45° from a substrate could be processed from a 1.4 mm thick SU-8 layer. Thickness between a wall's upper and lower surfaces would depend on photomask design, and typical thicknesses could be several microns to tens of microns. More generally, a wall could be designed to be sufficiently flexible for multiple insertions.

Figure 27:
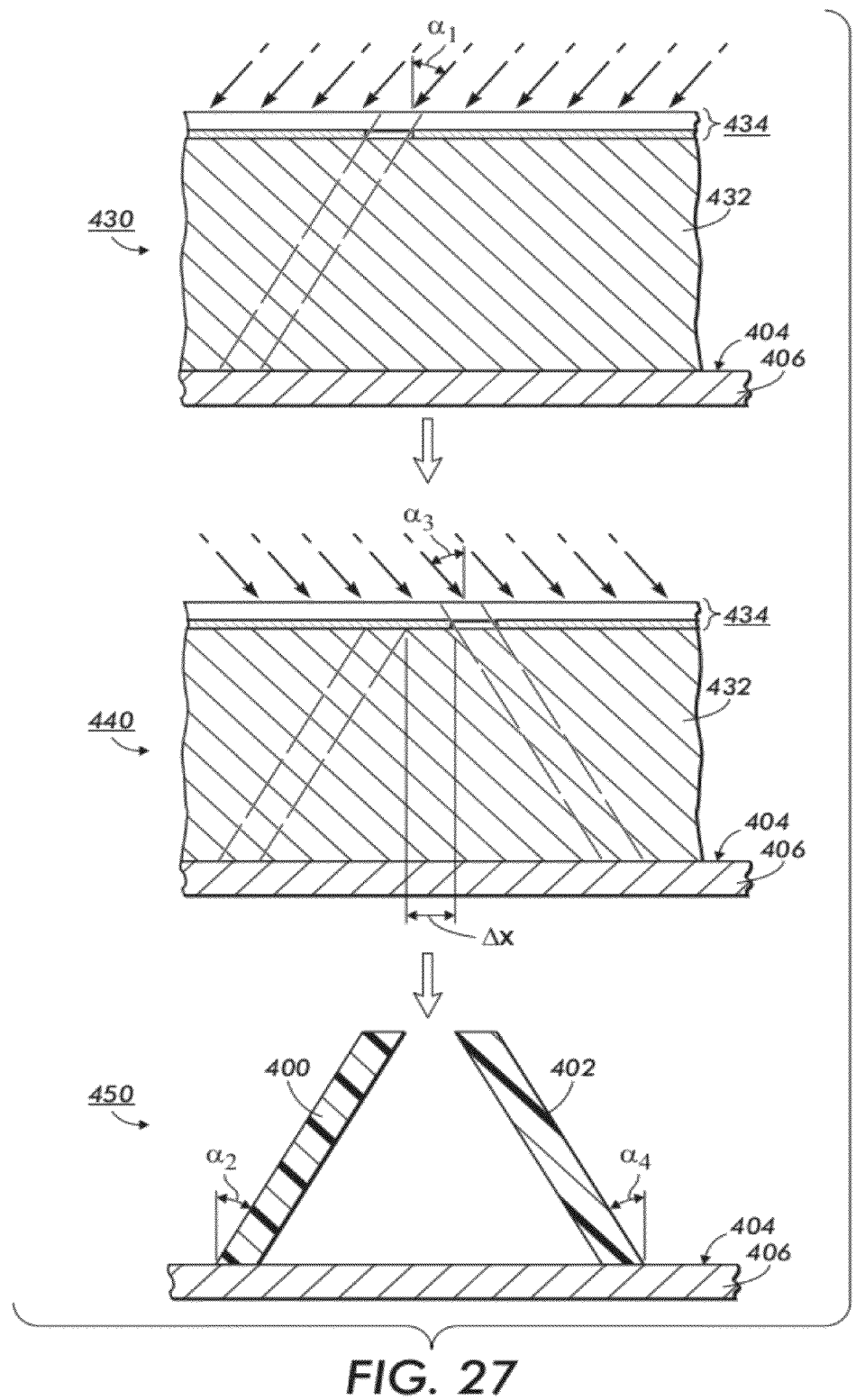
FIG. 27 shows a series of cross-sectional views along the line 27-27' in FIG. 26, showing stages in fabricating wall-like structures.

FIG. 27 shows a sequence of cross-sectional views along line 27-27' in FIG. 26. Although the operations illustrated in FIG. 27 are appropriate for producing a pair of walls or wall-like structures as in FIG. 26, they could also be performed to produce a pair of microstructures adjacent to each other, or a microstructure paired with a wall or wall-like structure.

Cross-section 430 is very similar to FIG. 3, above, and the operation performed can be understood from the description of FIG. 3 above. Photoresist layer 432 has been deposited on surface 404 of substrate 406. Layer 432 can, for example, be SU-8, DiaPlate, or another photoresist that can be used to produce relatively tall structures with high ratios of height to thickness. Layer 432 can have an appropriate thickness, such as between tens and a few thousands of microns. Masking structure 434 over layer 432 illustratively includes a single slot or opening through which light can be projected from a source onto layer 432; masking structure 434 could include a rectangular opening like those in mask portion 180 in FIG. 6, but much longer. As shown, light is received at the angle $\alpha_1$ from the normal, and the resulting exposed portion of layer 432 will as a result extend at an oblique angle $\alpha_2$ as described in relation to FIG. 3, above.

In cross-section 440, masking structure 434 has been moved a distance of $\Delta x$ to the right relative to layer 432. Light is received at the angle $\alpha_3$ from the normal, where $\alpha_3$ is approximately equal in magnitude but opposite in sign from $\alpha_1$. The exposed portion of layer 432 will similarly extend at an oblique angle $\alpha_4$ that is a function of $\alpha_3$, and $\alpha_4$ will also be approximately equal in magnitude but opposite in sign from $\alpha_2$.

Cross-section 450 shows the structure obtained after development of layer 432 and removal of nonexposed photoresist. As can be seen, structure 400 extends at the angle $\alpha_2$ from the normal to surface 404, while structure 402 extends at the angle $\alpha_4$ from the normal to surface 404.

Figure 28:
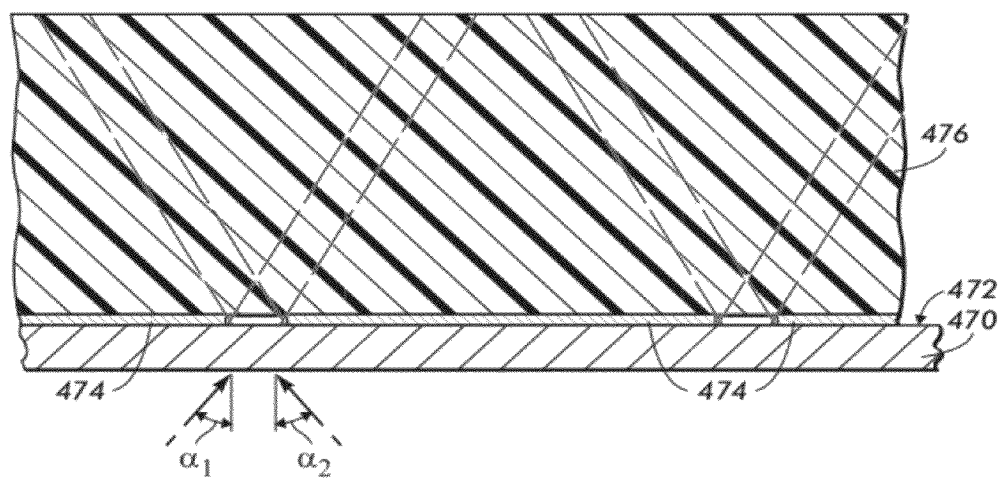
FIG. 28 shows a cross-sectional view illustrating an alternative to the technique of FIG. 27.

FIG. 28 illustrates another illumination technique that can be used to produce structures similar to wall-like structures 400 and 402 in FIG. 26. Rather than top-side illumination as in FIG. 27, the technique in FIG. 28 uses backside illumination. Transparent substrate 470 has a surface 472 on which mask 474 is formed with long rectangular openings as described above. Mask 474 may be any suitable material deposited on surface 472 and patterned to produce the rectangular openings. Photoresist layer 476 is then deposited over mask 474 as described above in relation to FIG. 27.

During a first backside illumination, light is incident on the backside of substrate 470 at the angle $\alpha_1$ from the normal. Then, during a second backside exposure, light is incident on the backside of substrate 470 at the angle α₂. The resulting exposed regions are therefore v-shaped with wall-like legs or wings extending toward each other.

Figure 29:
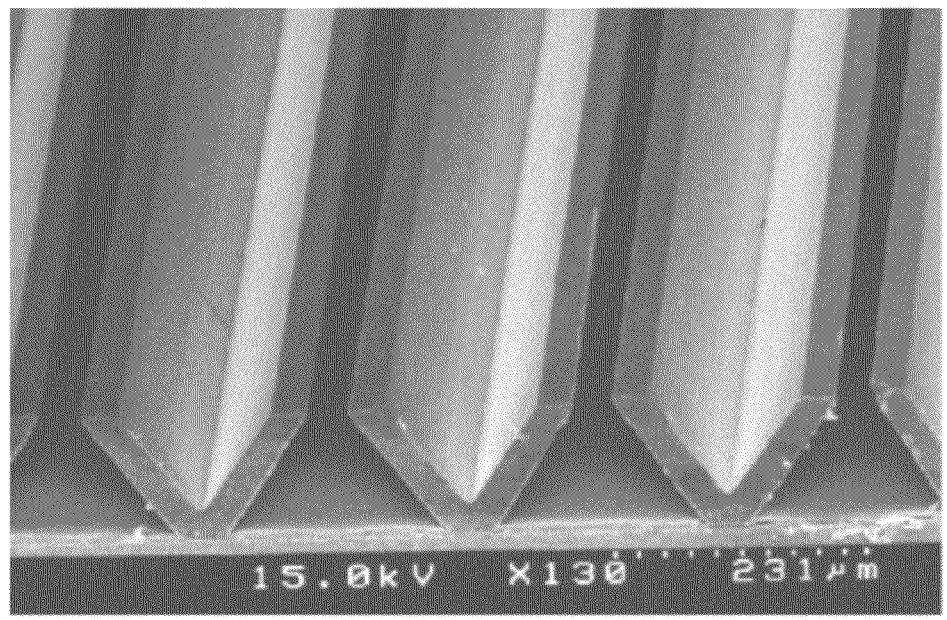
FIG. 29 is an image showing v-shaped structures produced by the technique illustrated in FIG. 28.
Figure 30:
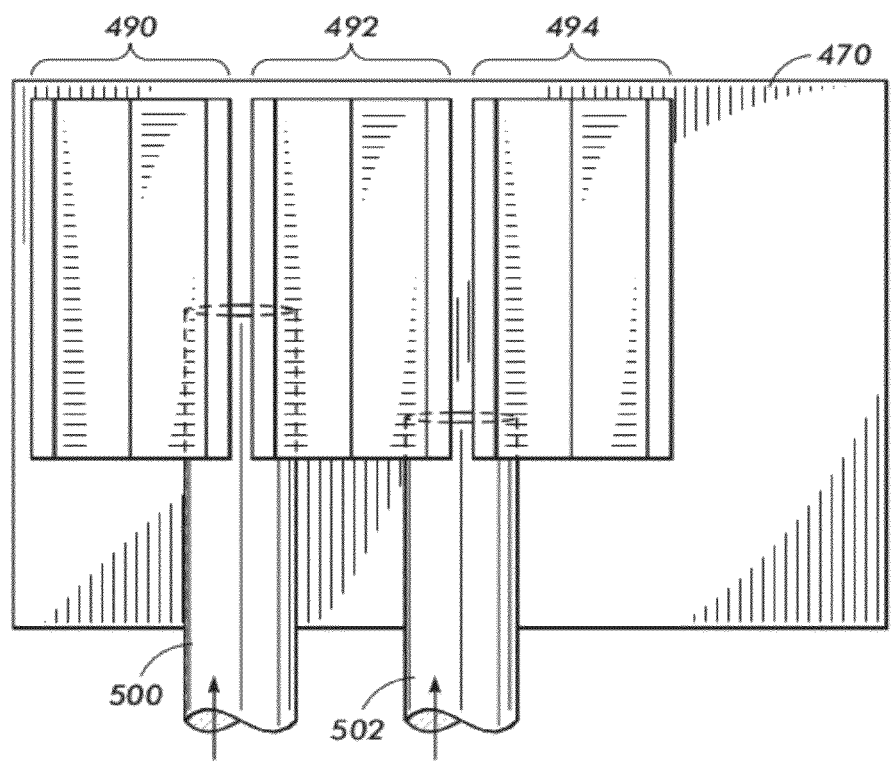
FIG. 30 is a schematic top view of v-shaped structures as in FIG. 29 holding objects inserted between them.

FIG. 29 illustrates an actual array of v-shaped structures that has been produced using the technique illustrated in FIG. 28. The structures shown in FIG. 29 were fabricated from a layer of SU-8 having a thickness of approximately 0.15 mm on a glass substrate using backside exposure. FIG. 30 shows schematically how tubular objects could be inserted between adjacent v-shaped structures as shown in FIG. 29. A portion of substrate 470 supports v-shaped structures 490, 492, and 494, which are parallel and adjacent in sequence. Optical fiber 500 is being inserted between structures 490 and 492 from the end, and capillary tube 502 is similarly being inserted between structures 492 and 494 from the end.

Insertion of a tubular object between a pair of oblique walls or wall-like structures can be problematic. If the walls are closely spaced with little separation, top insertion may be difficult, and end insertion may be desirable. With structures as in FIG. 30, however, improper end insertion may cause delamination of the v-shaped structures from the substrate.

Figure 31:
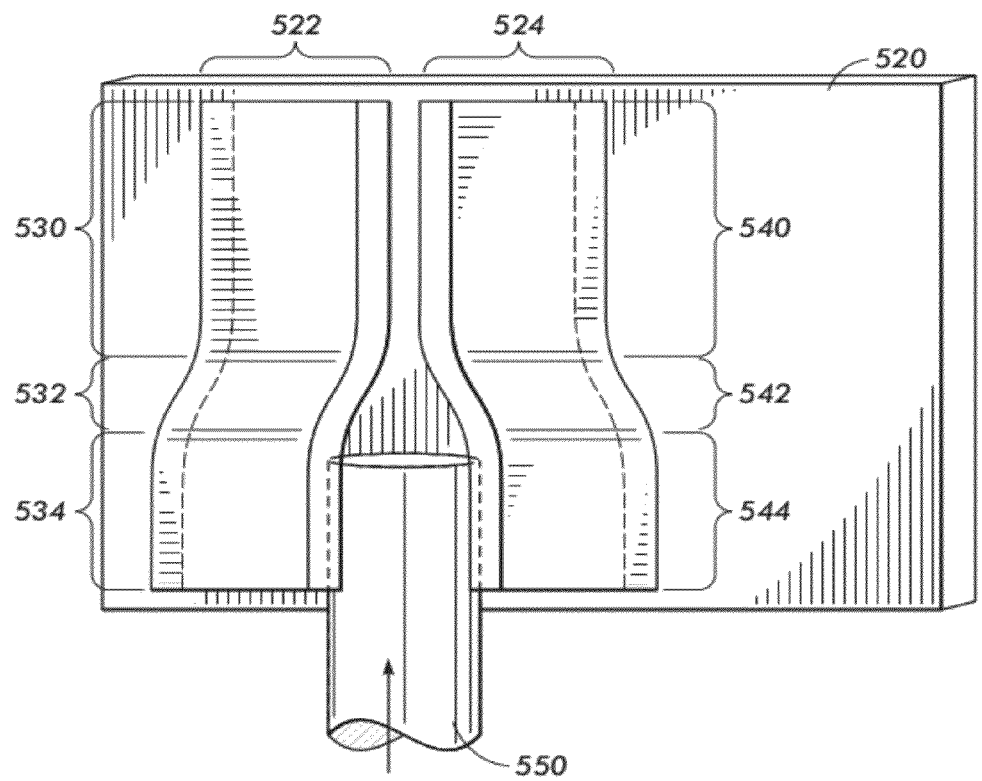
FIG. 31 is a schematic top view of apparatus in which two symmetrical wall-like structures have an end at which they are more spread apart to permit insertion of an object.

FIG. 31 illustrates walls that are symmetrical but, in addition to spring-like portions, also include spreading portions that facilitate insertion of a tubular object between the walls and the upper surface of substrate 520. Each of structures 522 and 524 is an oblique wall-like structure. Structures 522 and 524 could be produced using techniques similar to those described above in relation to FIGS. 27 and 28, but with mask openings shaped so that each structure includes both a spring-like portion and a spreading portion between the spring-like portion and an end to make insertion easier. Wall 522, for example, includes spring-like portion 530 and spreading portion 532, so that end portion 534 is a greater distance from structure 524 than portion 530 is. Similarly, structure 524 includes spring-like portion 540, spreading portion 542, and end portion 544, similarly a greater distance from structure 522 than portion 540 is. As a result, tubular object 550 can be more easily inserted because the space at the opening between end portions 534 and 544 is relatively wide. Similarly, tubular object 550 might be inserted from the top by a zipping action, with the part over end portions 534 and 544 inserted first and with the remainder inserted progressively upward from the end opening through the spreading portions 532 and 542 and then along the spring-like portions 530 and 540.

In general, wall-like structures as described above are especially appropriate for clipping or holding tubular objects, but objects of any other appropriate shape could be inserted and held by such structures. Furthermore, any appropriate insertion technique could be used in addition to those described above. Although additional measures such as glue or other attachment techniques could be used to hold an object more firmly, in many applications the spring force of the structures will be sufficient to hold an object in position. It may be beneficial, however, to provide additional positioning accuracy, using techniques as illustrated in FIG. 21, described above, and in FIGS. 32 and 33.

Although described above in relation to a microstructure implementation, the cross-section of FIG. 21 is also applicable to a wall or wall-like structure that exceeds the size of a microstructure. In this case, object 302 can be laterally inserted from the right in FIG. 21, and is held in place not only by the spring force of the wall or wall-like structure, but also by the sidewalls of blocks 300 and 302 (or, if block 300 is omitted, by the sidewall of block 302 alone). Sidewalls for precise lateral alignment can be produced, for example, by patterning a layer of photoresist or metal on the substrate. Also, a v-groove or other similar groove may be etched into the substrate. In each of these examples, the oblique wall or walls serve primarily to provide spring force, pressing the object against the sidewalls or into the groove. Exact symmetry of the oblique walls or wall-like structures and the precise angle become less important, because the sidewalls or groove ensure lateral stability despite differences in height or angle of the oblique structures.

Figure 32:
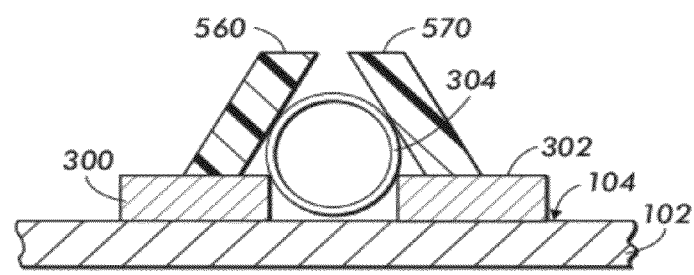
FIG. 32 shows a cross-sectional view of another exemplary implementation in which two wall-like structures hold an object in position.
Figure 33:
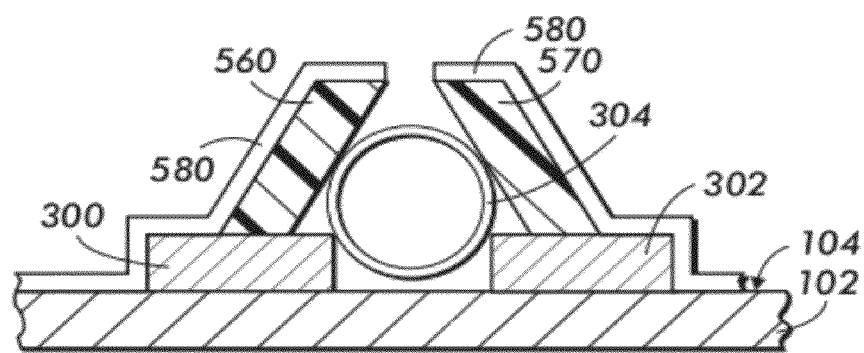
FIG. 33 shows a cross-sectional view of yet another exemplary implementation in which two wall-like structures hold an object in position.

In FIG. 32, wall-like structures 560 and 570 together hold object 304 in position between the sidewalls of blocks 300 and 302. In FIG. 33, an additional layer 580 of metal or other material has been coated onto structures 560 and 570 as well as other exposed surfaces by a process such as sputtering, evaporation, or plating. Compared with FIG. 32, the structures of FIG. 33 may be more rigid and less prone to fracture. If layer 580 is sufficiently resilient, photoresist could be removed, thus removing structures 560 and 570 but leaving metal clips that could be used to hold an object and, if the object is an electrical wire, for example, to provide a conductive path to other components.

Figure 34:
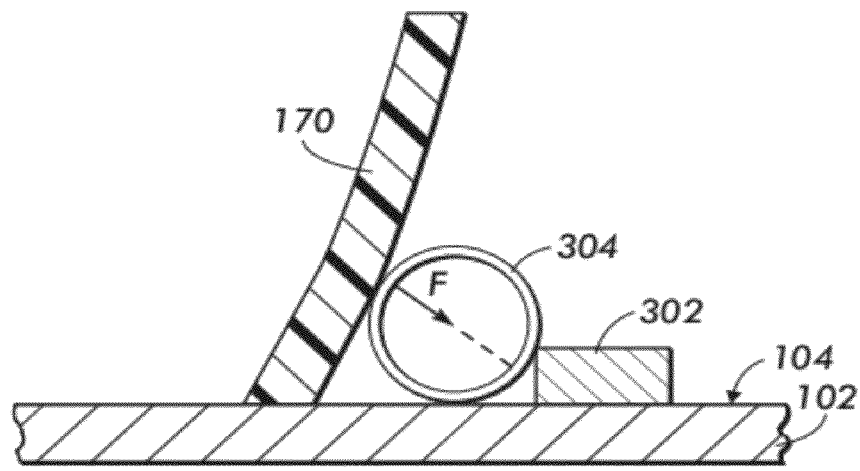
FIG. 34 shows a cross-sectional view of another exemplary implementation in which one wall-like structure holds an object in position against a sidewall.

FIG. 34, described with the same reference numerals as FIG. 21, illustrates an application in which object 304 is held in place against a single sidewall of block 302. Wall-like structure 170 (which could be a microstructure) and alignment block 302 are each formed directly on surface 104, positioned so that object 304 is held in place by the sidewall of block 302 after being laterally inserted from the right in FIG. 34. During insertion, object 304 applies deflecting force away from surface 104 to the lower surface of wall-like structure 170, but the deflection is sufficient to allow insertion. After insertion, the spring force F is sufficient to hold object 304 in place.

In addition to sidewalls or a groove, other types of structures could be used to provide precise lateral alignment of an object held in place by oblique walls or wall-like structures. For example, the object could be held in position against a vertical wall or against a series of posts.

FIG. 35 illustrates application of the structure shown in FIG. 32 for a particularly promising application in microfluidics. In the illustrated example, object 304 is a capillary tube pushed against microchannel 590, which could be fabricated from a photoresist such as SU-8. The sidewalls of blocks 300 and 302 are shown by dashed lines, and serve to hold object 304 in lateral position. At the same time, structures 560 and 570 act as clips, holding object 304 against blocks 300 and 302. Gasket 592 at the end of the capillary tube acts as a sealant, and may be constructed from silicone or other suitable material.

FIG. 36 shows another exemplary implementation that is similar to that of FIG. 26, but with two rows of oblique cylinder-like microstructures instead of wall-like structures 400 and 402. The first row includes microstructures 600 and 602, and the second row includes microstructures 610, 612, and 614. Each microstructure has uniformly oblique upper and lower surfaces, which can result from an oblique radiation process that produced it from a layer of polymer on surface 404 of substrate 406; the process can be similar to one of the processes described above in relation to FIGS. 27 and 28. In addition, along each side between its upper and lower surfaces, each microstructure can have a rounded side surface to facilitate insertion of object 410 from an end. Microstructures 600 and 610 are illustratively opposite each other, while microstructure 602 is illustratively offset but across from microstructures 612 and 614, another arrangement that can hold object 410 between the lower surfaces of the microstructures and surface 404. In general, the microstructures could be in any suitable arrangement on opposite sides of the inserted position of object 410.

Some of the above exemplary implementations involve specific materials, such as photoresists and metals, but the invention could be implemented with a wide variety of materials, including various substrates and other support structures, various polymer and photoresist materials, various seed layers, and various plating materials. In particular, semiconductor and other metal and non-metal substrates could be used, and various non-metal plating materials could be used, such as polypyrrole and other conductive polymers; ceramic coatings such as nickel-ceramic composites; and calcareous deposits. Also, magnetic metals and alloys could be used such as plated Ni, CoNi, NiFe, FeCo, FeCoNi, etc., as described in Andricacos, P. C. and Robertson, N., "Future directions in electroplated materials for thin film recording heads," *IBM Journal of Research and Development*, Vol. 42, No. 5, 1998, pp. 671-680. Also, layers of magnetic and non-magnetic material could be plated. Furthermore, solder materials could be plated such as PbSn, BiSn, or others.

The exemplary implementations generally include a structure with an oblique part, and the angle of obliqueness measured from the normal could vary from a relatively small angle such as approximately 10°, just sufficient to ensure that an error will not produce a vertical structure, to the largest angle achievable with the techniques being used. An angle as great as approximately 70° may be achievable, such as with exposure through a prism, as in FIG. 22. In general, smaller angles allow denser packing of microstructures or wall-like structures, while higher angles provide cantilevered elements with better vertical compliance. For specific implementations, these and other competing constraints may mean that intermediate angles are advantageous, such as 20°, 30°, 40°, 45°, or 60°.

Some of the exemplary implementations include uniformly oblique surfaces, or sections of surfaces, resulting from oblique radiation techniques. It is foreseeable, however, that other techniques will be developed for producing uniformly oblique surfaces, and the invention is not limited to uniformly oblique surfaces produced by oblique radiation techniques.

Similarly, the above exemplary implementations suggest certain dimensions, but a wide range of dimensions would fall within the scope of the invention, subject to relevant constraints. For example, some of the above embodiments include substantially planar parts that are much thinner than the width and length of their surfaces, but thicker parts would also come within the scope of the invention.

In some of the exemplary implementations, a part of an electrically conductive component of a microstructure or wall-like structure covers a contact, and, in general, a part of a microstructure or wall-like structure could extend to other structures on a substrate, such as via contacts, other microstructures or wall-like structures, through-wafer vias, and so forth. Electrically conductive microstructures could be used for signal and power distribution. Thermally conductive microstructures or wall-like structures could be used for heat distribution.

A few exemplary applications are described above, but many others could be identified. For example, microstructures and wall-like structures in accordance with the invention could also serve simply as "springy" mechanical structures, e.g. as springy spacers in an assembly. Various other clip applications are foreseeable, such as clipping an object in an anisotropically etched groove in a silicon substrate or with a polymeric alignment structure or electroplated groove. In addition, in the clip applications, each wall-like structure might be replaced by a spring cantilever or by a series of spring cantilevers; in some applications, two spring cantilevers opposite each other may suffice.

Exemplary implementations described above could be modified to provide lateral compliance, such as by placing appropriate bends in a microstructure's spring cantilever, such as in second part 114 of the microstructure in FIG. 1.

Some exemplary implementations shown above have a tip on the free part or end of a microstructure, but the free part could simply terminate at an end and various other structures could be on the free part, including a bump, a structure formed from a solderable material, or some other type of structure.

The above exemplary implementations generally involve production of microstructures and wall-like structures following particular operations, but different operations could be performed, the order of the operations could be modified, some operations could be omitted, and additional operations could be added within the scope of the invention. For example, radiation of any appropriate wavelength and intensity could be used in oblique radiation processes. Also, plating could be performed in many different ways, including various electroplating and electroless plating techniques, and molds for plating an oblique part could be produced in any appropriate way, including molding/embossing or laser ablation. In addition, where contacts are present, they could be produced at any appropriate stage in a sequence.

While the invention has been described in conjunction with specific exemplary implementations, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method of use comprising:
applying deflecting force to a cantilevered element; the cantilevered element having a base supported on a support surface, the cantilevered element extending from the base to a free part; the cantilevered element including a spring-like portion that, when undeflected, extends obliquely from the base to the free part; the spring-like portion having an oblique radiation artifact, wherein applying the deflecting force involves inserting an object between the cantilevered element and the support surface; and
in response to deflecting force,
providing deflection and spring force within required ranges from the spring-like portion, and
holding the object between the cantilevered element and the support surface.

2. The method of claim 1 wherein inserting the object under the cantilevered element applies deflecting force away from the support surface; the required ranges of deflection and spring force being such that, in response to deflecting force, the spring-like portion allows insertion of the object and holds the object between the spring-like portion and the support surface after insertion of the object.

3. The method of claim 1, wherein the artifact of the oblique radiation comprises photoresist.

4. The method of claim 1, wherein the artifact of the oblique radiation comprises a polymer and the oblique radiation is oblique laser radiation.

5. The method of claim 1, wherein the deflecting force is applied to the spring-like portion in a direction having a component normal to the support surface and upward from the support surface that supports the base towards the spring-like portion.

6. The method of claim 5, further comprising a block on the base, wherein the required ranges of the deflecting force are sufficient to hold an object between the base and the cantilevered element in contact with the block and a lower surface of the cantilevered element.

7. The method of claim 1, wherein:
the cantilevered element is a first cantilevered element and further comprising a second cantilevered element that comprises a second artifact of oblique radiation that extends obliquely from the base towards the first cantilevered element; and
wherein the method further comprises holding an object between lower surfaces of the first cantilevered element, the second cantilevered element, and the base.

8. The method of claim 1, wherein the artifact of the oblique radiation comprises one or more of photoresist, polymer, and metal.

9. A method of using an apparatus, the apparatus comprising:
a structure with a support surface; and
a cantilevered element fabricated from material deposited over the support surface; the cantilevered element having a base supported on the support surface and extending from the base to a free part; the cantilevered element including:
a flexible polymer component extending from the base to the free part; between the base and the free part, the polymer component including:
a spring-like portion including an artifact of oblique radiation, the spring like portion, when undeflected, extends obliquely along a length between the base and the free part; and
a surface that, along most of the spring-like portion's length, is uniformly oblique relative to the support surface;
the spring-like portion being structured to respond to deflecting force applied to the cantilevered element in use by providing deflection and spring force within required ranges;
the method comprising:
applying deflecting force to the cantilevered element; and
in response to deflecting force, providing deflection and spring force within required ranges from the spring-like portion, wherein the oblique radiation is collimated radiation and the artifact of the oblique radiation extends from the base at an angle $\alpha_2$, wherein $\alpha_2$ is related to an angle of the collimated oblique radiation, $\alpha_1$.

10. The method of claim 9 in which an object contacting the cantilevered element's free part applies deflecting force toward the support surface; the required ranges of deflection and spring force being such that, in response to deflecting force, the free part moves to a position responsive to the object's position and the free part maintains contact with the object.

11. The method of claim 9, wherein the material deposited over the support surface is deposited by one or more of sputter coating, evaporation, and electrodeposition.

12. The method of claim 9, wherein after deposition of the material, the material is patterned.

13. The method of claim 9, wherein the cantilevered element is fabricated by deposition and patterning of multiple layers of materials.

14. The method of claim 9, wherein the oblique radiation comprises one or more of collimated light, laser light, X-rays, and UV light.

15. A method, comprising:
applying a deflecting force to a cantilevered element, the cantilevered element formed of a layer of material deposited over a support surface and having a base supported on the support surface, the cantilevered element comprising one or more of photoresist and polymer and extending from the base to a free part; the cantilevered element including a spring-like portion that, when undeflected, extends obliquely from the base to the free part; the spring-like portion including an artifact of collimated oblique radiation; and
in response to deflecting force, providing deflection and spring force within required ranges from the spring-like portion.

16. The method of claim 15, wherein the collimated oblique radiation is one or more of UV light and X-rays.

17. The method of claim 15, wherein the oblique radiation comprises laser radiation.

* * * * *